United States Patent
Kurihara et al.

(10) Patent No.: US 9,496,068 B2
(45) Date of Patent: Nov. 15, 2016

(54) COATED SILVER NANOPARTICLES AND MANUFACTURING METHOD THEREFOR

(75) Inventors: Masato Kurihara, Yamagata (JP); Masaomi Sakamoto, Yamagata (JP)

(73) Assignee: Yamagata University, Yamagata-shi (JP)

(*) Notice: Subject to any disclaimer, the term of this patent is extended or adjusted under 35 U.S.C. 154(b) by 47 days.

(21) Appl. No.: 13/264,204

(22) PCT Filed: Mar. 31, 2010

(86) PCT No.: PCT/JP2010/002381
§ 371 (c)(1),
(2), (4) Date: Nov. 10, 2011

(87) PCT Pub. No.: WO2010/119630
PCT Pub. Date: Oct. 21, 2010

(65) Prior Publication Data
US 2012/0043510 A1    Feb. 23, 2012

(30) Foreign Application Priority Data

Apr. 17, 2009    (JP) ................. 2009-100926
Mar. 3, 2010    (JP) ................. 2010-047170

(51) Int. Cl.
   *H01B 1/22*        (2006.01)
   *B05D 5/12*        (2006.01)
(Continued)

(52) U.S. Cl.
CPC *H01B 1/22* (2013.01); *B05D 5/12* (2013.01); *B22F 1/0022* (2013.01);
(Continued)

(58) Field of Classification Search
CPC ............ H01B 1/00; H01B 1/22; B05D 5/12; C09D 5/24; B22F 1/0062
USPC .............................................. 252/500–521.6
See application file for complete search history.

(56) References Cited

U.S. PATENT DOCUMENTS 3,702,259 A * 11/1972 Nielson .................. 427/229
2002/0018896 A1 2/2002 Fukunaga et al.
(Continued)

FOREIGN PATENT DOCUMENTS

| CN | 1871085 A | 11/2006 |
|----|-----------|---------|
| JP | 2005-298921 | 10/2005 |

(Continued)

OTHER PUBLICATIONS

Kawazome, et al., Pulverization No. 50 (2006/2007), "Nano Particles Fine Pitch Wiring for Printed Electronics", pp. 27-31.
(Continued)

*Primary Examiner* — Mark Kopec
(74) *Attorney, Agent, or Firm* — Knobbe Martens Olson & Bear LLP

(57) ABSTRACT

The present invention provides coated silver nanoparticles for use as an electrically conductive material capable of sintering at lower temperatures that is able to be used even with flexible printed substrates having low heat resistance, and a manufacturing method therefor. The coated silver nanoparticles of the present invention have a mean particle diameter of 30 nm or less and are coated with protective molecules amine, and are characterized in that the weight loss rate when heated to 160° C. in thermogravimetric measurement is 30% or more. The coated silver nanoparticles of the present invention are also characterized in that a silver-colored sintered film can be formed by sintering at a temperature of 100° C. or lower for 1 hour or less. These coated silver nanoparticles are manufactured by mixing a silver compound that forms metallic silver when decomposed by heating, an alkylamine and an alkyldiamine to prepare a complex compound, and by thermally decomposing the silver compound by heating the complex compound.

8 Claims, 8 Drawing Sheets

(51) Int. Cl.
*C09D 5/24* (2006.01)
*B22F 1/00* (2006.01)
*B22F 9/30* (2006.01)
*B82Y 30/00* (2011.01)
*H05K 1/09* (2006.01)

(52) U.S. Cl.
CPC .............. *B22F 1/0062* (2013.01); *B22F 9/30* (2013.01); *B82Y 30/00* (2013.01); *C09D 5/24* (2013.01); *B22F 2998/00* (2013.01); *B22F 2999/00* (2013.01); *H05K 1/097* (2013.01)

(56) References Cited

U.S. PATENT DOCUMENTS

| | | | |
|---|---|---|---|
| 2002/0091291 A1* | 7/2002 | Nakashiro | 568/956 |
| 2005/0129843 A1* | 6/2005 | Wu et al. | 427/180 |
| 2006/0073667 A1 | 4/2006 | Li et al. | |
| 2006/0150776 A1 | 7/2006 | Nakamoto et al. | |
| 2007/0098883 A1 | 5/2007 | Itoh et al. | |
| 2007/0160837 A1 | 7/2007 | Chikamori et al. | |
| 2009/0223410 A1 | 9/2009 | Jun et al. | |
| 2009/0236567 A1 | 9/2009 | Ogi et al. | |
| 2010/0189901 A1 | 7/2010 | Chung et al. | |
| 2010/0247422 A1* | 9/2010 | Chung et al. | 423/604 |
| 2011/0039096 A1* | 2/2011 | Wu et al. | 428/336 |

FOREIGN PATENT DOCUMENTS

| | | |
|---|---|---|
| JP | 2006-104576 A | 4/2006 |
| JP | 2006-183072 A | 7/2006 |
| JP | 2007-46162 A | 2/2007 |
| JP | 2008-214695 | 9/2008 |
| JP | 2009030170 A * | 2/2009 |
| JP | 2009-068035 | 4/2009 |
| JP | 2009-535497 A | 10/2009 |
| KR | 10-2006-0069491 A | 6/2006 |
| KR | 20080013787 A | 2/2008 |
| TW | 200408477 A | 6/2004 |
| TW | 200812730 A | 3/2008 |
| TW | 200815123 A | 4/2008 |
| WO | 01/70435 A1 | 9/2001 |
| WO | 2005075132 A1 | 8/2005 |
| WO | 2007105636 A1 | 9/2007 |
| WO | 2007/120756 A2 | 10/2007 |
| WO | 2008018718 A1 | 2/2008 |
| WO | WO 2011126706 * | 10/2011 |

OTHER PUBLICATIONS

International Search Report in corresponding PCT Publication No. PCT/JP2010/002381.
Office Action issued on May 8, 2013 for Korean Patent Application No. 10-2011-7025595.
Tobita, Motoi and Yasuda, Yusuke, Theoretical and experimental vibrational characterizations of amine-coated silver nanoparticles, J. Phys. Chem. C, vol. 112, No. 36, 2008, pp. 13851-13855.
Office Action issued Feb. 19, 2014 in corresponding Chinese Patent Application No. 201080016596.4.
Office Action issued Apr. 1, 2014 in corresponding Japanese Patent Application No. 2010-047170.
Notice of Allowance issued Mar. 18, 2014 in corresponding Korean Patent Application No. 10-2011-7025595.
Office Action received in connection to the corresponding Taiwanese Application No. 099109869 dated Jun. 4, 2014.
Office Action issued May 26, 2015 in JP Application No. 2014-111297.

* cited by examiner

SILVER IS UNIFORMLY COATED ONTO EACH OF THE MESH FIBERS

COATED SILVER NANOPARTICLES AND MANUFACTURING METHOD THEREFOR

RELATED APPLICATIONS

This application is the U.S. National Phase filing under 35 U.S.C. §371 of PCT/JP2010/002381, filed Mar. 31, 2010, which designated the United States and was published in a language other than English, which claims priority under 35 U.S.C. §119(a)-(d) to Japanese Patent Application No. 2009-100926, filed Apr. 17, 2009, and to Japanese Patent Application No. 2010-047170, filed Mar. 3, 2010. The contents of these applications are incorporated herein by reference in their entireties.

TECHNICAL FIELD

The present invention relates to coated silver nanoparticles that have superior dispersibility in a solvent and demonstrate favorable electrical conductivity as a result of low-temperature sintering on a flexible printed substrate and the like, a manufacturing method therefor, and a sintered silver adherend using the same.

BACKGROUND ART

Advances in the field of semiconductor devices and other electronic components along with the considerable development of printed wiring substrates on which these electronic components are mounted have been behind the remarkable progress achieved in the field of electronic devices. Since many of these electronic devices are required to be more compact, have reduced thickness and be lightweight while also offering improved productivity, printed wiring substrates have been required to incorporate various contrivances and improvements in accommodation thereof. In particular, the mounting of electrically conductive wiring forming materials of electronic components is being required to offer greater speed and higher density as a result thereof.

Amidst such circumstances, if a material were available that enabled wiring forming materials to be mounted at even lower temperatures, since fine electronic circuits would also be able to be formed on various types of easily processed organic polymer substrates such as polyethylene terephthalate (PET) or polypropylene having heat resistance lower than polyimides in addition to polyimides already used as flexible printed wiring substrates, there are considerable expectations placed on the appearance of such a new material. Accompanying advances in inkjet printing technology, nanosized metal fine particles are currently expected to serve as such a material, and studies for that purpose are currently being conducted (see, for example, Non-Patent Document 1). However, since the minimum sintering temperature thereof has thus far been determined to be only 150° C., efforts are continuing to seek out a material capable of being sintered at even lower temperatures. In addition, the generation of waste products containing by-products formed from the large amounts of reaction solvents, surplus protective molecules and reducing agents used to synthesize these metal fine particles is also required to be improved from the viewpoints of conserving resources and ecology.

According to studies conducted thus far, Patent Document 1, for example, discloses a method for manufacturing composite metal nanoparticles comprising heat treatment of two or more types of transition metal salts and amine compounds in an inert atmosphere. It is disclosed that nanoparticles are formed having a particle diameter on the nanometer (nm) level, the nanoparticles are dispersed in a somewhat non-polar solvent such as toluene, hexane, ligroin, petroleum ether or ethyl ether, and the nanoparticles are sintered by heat treatment at 200° C. to 300° C. However, it is unclear as to whether or not these nanoparticles exhibit electrical conductivity. In addition, since the heat treatment temperature is 200° C. or higher, only a polyimide and the like having considerably high heat resistance can be used even for an organic substrate having favorable processability.

In addition, Patent Document 2 discloses that coated silver nanoparticles having a uniform particle diameter are only obtained in the case an oleylamine, which is an unsaturated long-chain aliphatic amine, as an essential constituent is reacted with silver oxalate and a saturated aliphatic amine. However, dispersibility of the resulting coated silver nanoparticles in solvent, their sintering temperature and their electrical conductivity are not adequately examined or disclosed. In actuality, further improvement of these nanoparticles is required.

The reason why the silver nanoparticles described in Patent Documents 1 and 2 form a metal film by sintering at a temperature of about 200° C. that is much lower than the melting point of silver is that since such silver nanoparticles have an extremely large specific surface area, the tendency for the surface area to become even less due to the surface tension thereof becomes extremely strong. Consequently, in the case of carrying out low-temperature sintering, it is necessary to impart a large specific surface area by making the mean particle diameter of the silver nanoparticles as small as possible. However, when silver nanoparticles are simply attempted to be manufactured that have a small mean particle diameter, the particles end up aggregating (sintered) in the manufacturing process thereof due to the surface tension of the silver nanoparticles, thereby resulting in the problem of only being able to obtain coarse particles that do not demonstrate any further low-temperature sintering.

In order to solve such problems and stably manufacture fine silver nanoparticles or enhance the storability of manufactured silver nanoparticles, in the silver nanoparticles described in Patent Document 2, as previously described, together with manufacturing silver nanoparticles by using an oleylamine, which is an unsaturated long-chain aliphatic amine, as an essential constituent and using decomposition of silver oxalate, the surfaces of the manufactured silver nanoparticles are protected with the oleylamine to manufacture silver nanoparticles having a mean particle diameter of about 20 nm. In the case of these silver nanoparticles, since direct contact by surfaces of the silver nanoparticles is prevented by the presence of oleylamine molecules on the surface thereof, unintended sintering and aggregation of the silver nanoparticles during the manufacturing process and storage are prevented.

PRIOR ART DOCUMENTS

Patent Documents

Patent Document 1: Japanese Unexamined Patent Application, First Publication No. 2005-298921

Patent Document 2: Japanese Unexamined Patent Application, First Publication No. 2008-214695

Non-Patent Documents

Non-Patent Document 1: Kawazome, M. et al., Pulverization, No. 50, 27-31 (2006/2007)

SUMMARY OF THE INVENTION

Problems to be Solved by the Invention

However, as previously described, even in the case of attempting to actually carry out sintering using these silver nanoparticles in which the surfaces thereof have been protected by an oleylamine, which is an unsaturated long-chain aliphatic amine, contact between surfaces of the silver nanoparticles is obstructed by the presence of the oleylamine, thereby resulting in the problem of being unable to adequately lower the sintering temperature.

In order to solve such a problem, an object of the present invention is to provide coated silver nanoparticles that allow silver nanoparticles to be adequately formed and prevent the aggregation (sintering) thereof during the manufacturing process and storage thereof, while also enabling sintering to be carried out at a low temperature in the case of attempting to sinter the silver nanoparticles, and to provide a manufacturing method therefor. More specifically, an object of the present invention is to provide coated silver nanoparticles capable of being sintered at 120° C. or lower, and at an even lower temperature of 100° C. or lower, for use as a novel electrically conductive material capable of sintering at lower temperatures that is able to be used even with flexible printed substrates having low heat resistance, and to a manufacturing method therefor.

Means for Solving the Problems

The present invention is characterized as described below in order to solve the aforementioned problems.

1. Coated silver nanoparticles having a mean particle diameter of 30 nm or less and coated with protective molecules, characterized in that the weight loss rate of the protective molecules amine when heated to 160° C. in thermogravimetric measurement is 30% or more.

2. Coated silver nanoparticles having a mean particle diameter of 30 nm or less and coated with protective molecules, characterized in that a silver-colored metal film can be formed by sintering at a temperature of 100° C. or lower for 1 hour or less.

3. Coated silver nanoparticles, wherein the protective molecules contain as main components thereof a medium- to short-chain alkylamine having a boiling point within the range of 100° C. to 250° C. and a medium- to short-chain alkyldiamine having a boiling point within the range of 100° C. to 250° C.

4. A coated silver nanoparticle dispersion, characterized in that any of the aforementioned coated silver nanoparticles are dispersed in a dispersion medium.

5. A manufacturing method of coated silver nanoparticles, comprising: a first step for mixing a silver compound that forms metallic silver when decomposed by heating, a medium- to short-chain alkylamine having a boiling point of 100° C. to 250° C. and a medium- to short-chain alkyldiamine having a boiling point of 100° C. to 250° C. to prepare a complex compound containing the silver compound, the alkylamine and the alkyldiamine, and a second step for thermally decomposing the silver compound by heating the complex compound.

6. The manufacturing method of coated silver nanoparticles, wherein silver oxalate is used for the silver compound that forms metallic silver when decomposed by heating.

7. The manufacturing method of coated silver nanoparticles, wherein the content ratio of the alkyldiamine to the total amount of amines in the alkylamine and alkyldiamine mixed with the silver compound is 10 mol % to 90 mol %.

8. The manufacturing method of coated silver nanoparticles, wherein in the first step, a fatty acid is further mixed in at 5 mol % or less based on the silver atoms contained in the reaction system.

The present invention as characterized in this manner was completed on the basis of the following findings of the inventor.

Namely, as a result of conducting extensive studies in view of the conventional problems, the inventor of the present invention surprisingly found that when manufacturing silver nanoparticles by decomposing a silver compound serving as a silver raw material, by interposing a medium- to short-chain alkylamine and a medium- to short-chain alkyldiamine having boiling points of 100° C. to 250° C., a complex compound can be synthesized in the absence of solvent, at a low temperature and in a short period of time, and by using this complex compound, coated silver nanoparticles can be manufactured that allow low-temperature sintering. More specifically, the inventor of the present invention found that by using a silver oxalate, for example, for the silver compound serving as the silver raw material and interposing a medium- to short-chain alkylamine and a medium- to short-chain alkyldiamine there between, a complex compound can be prepared in which the medium- to short-chain alkylamine and the medium- to short-chain alkyldiamine are coordinated with silver atoms contained in the silver oxalate, and by thermally decomposing the portion of the oxalate ions that compose the silver oxalate while in this state, coated silver nanoparticles that allow low-temperature sintering can be prepared at high yield. Moreover, in a coated film of coated silver nanoparticles fabricated on a plastic substrate by favorably dispersing the resulting coated silver nanoparticles in an organic solvent containing a polar solvent and using this dispersion, a favorable electrically conductive film can be obtained by low-temperature sintering of the coated silver nanoparticles at an extremely low temperature of 120° C. or lower, or even 100° C. or lower.

Effects of the Invention

According to the present invention, coated silver nanoparticles can be provided that can be sintered in the vicinity of room temperature of 120° C. or lower, or even 100° C. or lower, thereby enabling the formation of an electrically conductive film or electrically conductive wiring even on a plastic substrate having low heat resistance such as PET or polypropylene.

In addition, the aforementioned complex compound can be synthesized in the absence of solvent and at a low temperature (room temperature). Moreover, coated silver nanoparticles can be directly obtained by thermally decomposing the complex compound at a low temperature in the vicinity of 100° C., and since there is no need to separately add a reducing agent as in the manner of other methods, both energy and resource consumption can be reduced considerably. The method of the present invention is suitable for industrial production.

EMBODIMENTS OF THE INVENTION

Figure 1:
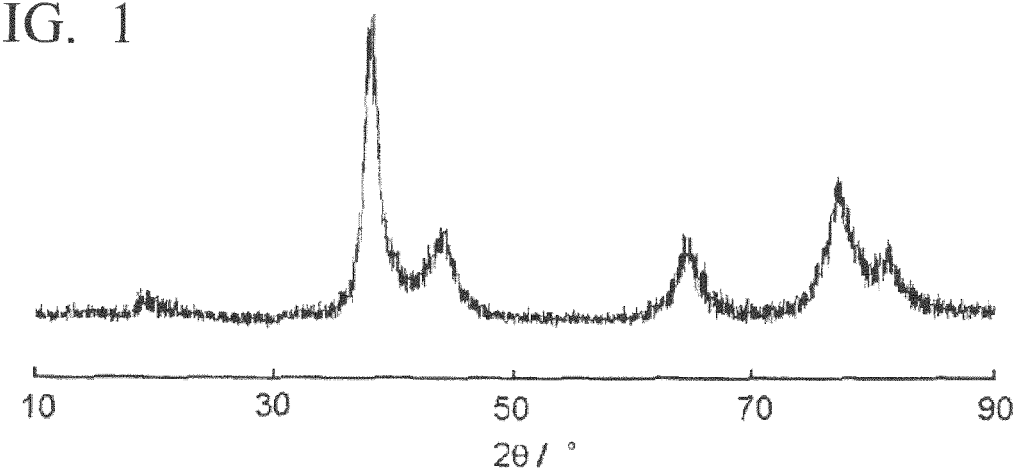
FIG. 1 indicates a powder X-ray diffraction pattern of coated silver nanoparticles obtained in an Example 1. The locations of the signal peaks coincide with the pattern of metallic silver. Since the signal peaks are broad, they are determined to be nanosized crystals. The size of single crystallites can be calculated from the half-widths of the signals.

The following provides an explanation of coated silver nanoparticles according to the present invention and a manufacturing method therefor. Among silver-containing compounds, a silver compound that is easily decomposed by heating to form metallic silver is preferably used for the raw material of the silver that composes the silver nanoparticles. Although examples of such silver compounds that can be used include silver carboxylates obtained by combining silver with a carboxylic acid such as formic acid, acetic acid, oxalic acid, malonic acid, benzoic acid or phthalic acid, as well as silver chloride, silver nitrate and silver carbonate, silver oxalate is used preferably from the viewpoint of easily forming metallic silver by decomposition and unlikely to form impurities other than silver. Since silver oxalate has a high silver content and allows oxalate ions to be decomposed and removed as carbon dioxide as a result of heating, metallic silver can be obtained as is by thermal decomposition without reducing agent, while also being advantageous in terms of causing little residual accumulation of impurities.

The present invention is characterized by adding a prescribed alkyldiamine and alkylamine to the aforementioned silver compound to form a complex compound of the silver compound and the amines. This complex compound contains silver, alkylamine, alkyldiamine and oxalate ions. In the complex compound of the silver compound and the amines obtained by mixing, the complex compound is presumed to be formed as a result of nitrogen atoms contained in the amines coordinate-bonding to each silver atom contained in the silver compound through unshared electron pairs thereof. Furthermore, in the present description, an alkylamine refers to an alkylamine having a single amino group, while an alkyldiamine refers to an alkylamine having two amino groups. In addition, cases of describing simply as an amine include both the aforementioned alkylamine and alkyldiamine.

The manufacturing method of the coated silver nanoparticles according to the present invention is characterized by next heating the complex compound of the silver compound and the amines under suitable conditions. As a result of this heating, the silver compound can be thermally decomposed to form metallic silver while maintaining coordinate bonding of the amines to silver atoms. For example, in the case of using silver oxalate for the silver compound, carbon and oxygen that compose the oxalate ions are removed as carbon dioxide as a result of heating, and thereby metal silver atoms coordinated with amines by coordinate bonding are obtained.

Silver atoms formed in this manner are electrically neutral, and since the amines are thought to be bound to the silver atoms by a force weaker than coordinate bonding, the amines can be eliminated at a comparatively low driving force, and this is thought to enable the metallic silver to be isolated. This coordination of the amines to electrically neutral silver in a state that enables them to be easily eliminated is thought to enable the coated silver nanoparticles obtained in the present invention to be sintered at an extremely low temperature in the vicinity of room temperature.

Metallic silver atoms coordinated with amines formed in this manner rapidly gather after they are formed, bond due to the mutual formation of metallic bonds, and form silver nanoparticles. At this time, since the amines coordinated to each silver atom form a protective film on the surface of the silver nanoparticles, after a fixed number of silver atoms have gathered to form silver nanoparticles, it is thought to become difficult for additional silver atoms to bond due to the protective film formed by the amines. Consequently, even in the case in which decomposition of the silver compound contained in the complex compound and formation of silver nanoparticles are carried out in the absence of a solvent and in a state in which silver atoms are present at extremely high density, silver nanoparticles are typically considered to be stably obtained having a uniform particle diameter of 30 nm or less. In addition, since silver nanoparticles are formed in the absence of solvent and in a state in which silver atoms are present at high density in this manner, the proportion of silver atoms that are not recovered as silver nanoparticles can be reduced, and the silver contained in the silver compound used can be recovered at high yield as silver nanoparticles. In addition, since the mean particle diameter of the resulting silver nanoparticles is 30 nm or less and may even be 20 nm or less, the silver nanoparticles can be adequately sintered even at a temperature in the vicinity of room temperature as a result of elimination of the protective film provided on the surface thereof.

When forming the complex compound of the silver compound and amines by adding an alkyldiamine and an alkylamine, the molar ratio between the silver atoms contained in the silver compound and the total amount of the alkylamine and alkyldiamine is preferably about 1:1 to 1:4. The complex compound of the silver compound and the amines is formed by mixing a prescribed amount of the amines with the silver compound and stirring at a low temperature tar enough below the boiling points of the amines until the mixture takes on viscosity. In addition, since the coordinated reaction of the amines to the silver compound generates heat, stirring is also preferably carried out while cooling to a temperature equal to or below room temperature as necessary in order to suppress initiation of a decomposition reaction of the silver compound.

During formation of the complex compound of the silver compound and the amines, if the amount of the amines is below the aforementioned range, the proportion of silver atoms to which the amines have not coordinated increases, and the silver nanoparticles obtained by thermal decomposition of the complex compound of the silver compound and amines become excessively large. In addition, since silver nanoparticles of roughly 30 nm or less are stably obtained by making the amines to be present at twice or more the amount of silver atoms, it is thought that all of the silver atoms can be reliably coordinated by the amines by roughly this amount of amines. If the amount of amines becomes four or more times the amount of silver atoms, since the density of silver atoms in the reaction system decreases, which in addition to causing a decrease in the final silver recovery yield also increases the burden on the environment, the amount of amines used is preferably four times or less the amount of silver atoms. Furthermore, in the case the molar ratio between silver atoms and the total amount of amines is about 1:1, since the complex compound is formed in which all of the amines have coordinated to the silver atoms and there is no longer any dispersion medium present for maintaining the reaction system, a reaction solvent such as methanol is preferably mixed in as necessary.

In addition, as will be explained below, the use of a medium- to short-chain alkylamine and a medium- to short-chain alkyldiamine both having boiling points of 100° C. to 250° C. for the alkyldiamine and alkylamine used to form the complex compound with the silver compound is preferable in terms of allowing the obtaining of coated silver nanoparticles able to be sintered at a low temperature. In other words, although it is necessary for the amines providing a protective film to be favorably eliminated from the surface of the coated silver nanoparticles at the sintering temperature in order to allow the silver nanoparticles obtained according to the present invention to be sintered at a low temperature, in the case of using amines having a low vapor pressure (high boiling point), the protective film is not removed and it is difficult to sinter the silver nanoparticles at a low temperature as a result of the amines remaining around the silver nanoparticles due to the cohesion force between amine molecules even after coordinate bonds to the silver atoms have been disrupted.

As a result of conducting various studies, it was determined that a protective film can be formed that can be eliminated at an adequate rate even at a temperature of about 150° C. or lower, thereby allowing the obtaining of coated silver nanoparticles able to be sintered at low temperatures by using an alkyldiamine and alkylamine having boiling points of 250° C. or lower as the main components of the amines used to form the complex compound with the silver compound. Furthermore, since dispersibility of the resulting coated silver nanoparticles in a non-polar solvent can be enhanced by containing a long-chain alkylamine such as oleylamine (boiling point: 349° C.) in the protective film, a long-chain alkylamine can be used as necessary by mixing with the amines for forming the complex compound with the silver compound. However, in the case of using this long-chain alkylamine, since the formation rate of the complex compound with the silver compound decreases along with a decrease in the elimination rate of the protective film, the amount of amine used having a boiling point of 250° C. or higher preferably has an upper limit of about 20 mol % of the total amount of amines used, and 80 mol % or more of the total amount of amines are preferably an alkyldiamine and alkylamine having a boiling point of 250° C. or lower as the main components of the protective molecules amine that form the protective film. In this case, the use of amines having a lower boiling point for the remaining amines is preferable in terms of lowering the sintering temperature of the silver nanoparticles.

In addition, in the case of using an alkyldiamine and alkylamine having boiling points of 100° C. or lower for the amines used to form the complex compound with the silver compound, cohesive force between amine molecules in the protective film of the silver nanoparticles decreases, and particularly with respect to the protective film becoming unstable during thermal decomposition of the silver compound contained in the complex compound and resulting in increased size of the silver nanoparticles formed, an alkyldiamine and alkylamine having boiling points of 100° C. or higher are preferably used as amines for forming the complex compound with the silver compound.

In addition, when using amines having boiling points of 100° C. to 250° C., in the case of using amines having boiling points of 180° C. or lower and low molecular weights in particular, the dispersibility of the resulting coated silver nanoparticles in a dispersion medium tends to decrease thereby resulting in restrictions on the type of dispersion medium used. On the other hand, in the case of using amines having a boiling point of 180° C. to 250° C., although the resulting coated silver nanoparticles demonstrate favorable dispersibility in various dispersion media, the sintering temperature tends to rise. Consequently, the use of a mixture of an amine having a boiling point of 100° C. to 180° C. and an amine having a boiling point of 180° C. to 250° C. for the amines used to form the complex compound with the silver compound is preferable since it allows both low-temperature sinterability and dispersibility in dispersion media. In addition, making the amount of the amine having a boiling point of 180° C. to 250° C. to be 2 mol % to 30 mol % of the total amount of amines at this time is preferable in terms of realizing both favorable low-temperature sinterability and dispersibility in dispersion media.

The present invention is characterized by the use of an alkylamine and an alkyldiamine as amines used to form the complex compound with the silver compound. Since alkyldiamines generally have greater polarity than alkylamines, alkyldiamines are preferable for increasing the reaction rate when forming the complex compound with the silver compound and enabling coordination of the amines to each of the silver atoms to be carried out reliably. In addition, when thermally decomposing the silver compound by heating the complex compound of the silver compound and the amines, in addition to thermal decomposition being completed at a low temperature and in a short period of time, the yield of silver ultimately obtained in the form of coated silver nanoparticles tends improve in the case of complex compounds containing alkyldiamine. In this manner, the effect resulting from using both alkylamine and alkyldiamine for the amines used to form the complex compound with the silver compound is remarkably observed in the case of using that which forms a coordination polymer such as silver oxalate for the silver compound in particular. Although the reason for this is unclear, alkyldiamines are presumed to effectively sever coordinate bonds mutually formed by silver oxalate and the like, and are used so as to enable the amines to reliably coordinate to the silver atoms.

Consequently, when using low boiling point amines for the purpose of lowering the sintering temperature of coated silver nanoparticles in particular, mixing the alkyldiamine at a suitable ratio is effective in terms of preventing elimination of amine from silver atoms during thermal decomposition of the silver compound. Moreover, since a protective film of the coated silver nanoparticles formed using an alkyldiamine has strong polarity, it can be expected to demonstrate an action of enhancing dispersibility in a polar solvent. On the other hand, since the bonding strength during coordinate bonding of the alkyldiamine to silver atoms is strong in comparison with the case of an alkylamine, in the case of using an excessive amount of alkyldiamine, a trend is observed in which the sintering temperature of the resulting coated silver nanoparticles becomes higher.

On the basis of the above, although the ratio of alkyldiamine among the amines used to form the complex compound with the silver compound is suitably selected corresponding the purpose of mixing, in order to ensure low-temperature sinterability of the coated silver nanoparticles, the ratio is preferably 90 mol % or less and more preferably 70 mol % or less. In addition, from the viewpoints of increasing the reaction rate when forming the complex compound with the silver compound and carrying out thermal decomposition of the complex compound at a low temperature and in a short period of time, the alkyldiamine is preferably used by mixing with alkylamine at a ratio of 10 mol % or more and preferably 20 mol % or more.

Furthermore, as was previously described, although the alkyldiamine used in the present invention is able to favorably form a complex compound with the silver compound provided the boiling point thereof is within the range of 100° C. to 250° C., one of the amino groups possessed by the alkyldiamine is particularly preferably a tertiary amine. This is because in the case both of the amino groups possessed by the alkyldiamine are primary amines or secondary amines, an extremely complex network is formed that tends to raise the thermal decomposition temperature of the silver compound as a result of both amino groups respectively coordinating to silver atoms of the silver compound.

When the complex compound of the silver compound and amines is heated while stirring, a suspension having a blue gloss is obtained, and by removing excess amine and the like from this suspension, the coated silver nanoparticles according to the present invention are obtained. As will be subsequently explained, by heating the complex compound of the silver compound and amines, the complex compound is thermally decomposed to metallic silver while maintaining coordinate bonding of the amines to the silver atoms, and coated silver nanoparticles coated with an amine protective film are thought to be obtained as a result of aggregation of the silver atoms coordinated with the amines.

The conditions when obtaining the coated silver nanoparticles by heating the complex compound of the silver compound and amines can be suitably selected from such conditions as the temperature, pressure and atmosphere when carrying out thermal decomposition corresponding to the types of silver compound and amines used. At this time, from the viewpoint of preventing contamination of the resulting coated silver nanoparticles due to reaction with the atmosphere in which thermal decomposition is carried out or preventing the protective film from being decomposed, thermal decomposition of the silver compound is preferably carried out in an inert atmosphere such as an argon atmosphere. On the other hand, in the case of using silver oxalate for the silver compound, since the reaction space is protected by carbon dioxide generated by decomposition of oxalate ions, the silver oxalate can be thermally decomposed by heating the complex compound of silver oxalate and amines in air.

Although a temperature equal to or lower than the boiling points of the amines used is generally preferable for the temperature at which the complex compound of the silver compound and amines is heated to thermally decompose the silver compound from the viewpoint of preventing the elimination of the amines, in the present invention, coated silver nanoparticles having a protective film composed of amines can generally be obtained by heating to about 80° C. to 120° C. Furthermore, in the case of using silver oxalate for the silver compound in the present invention, decomposition of the silver oxalate contained in the aforementioned complex compound has been confirmed to occur at about 100° C. Although the reason for the thermal decomposition temperature of silver oxalate being lowered by 100° C. or higher as a result of forming the complex compound in this manner is unclear, it is presumed to be due to the severing of a coordination polymer structure formed by pure silver oxalate during formation of the complex compound with the amines.

Due to the mechanism explained above, coated silver nanoparticles having a particle diameter of several nanometers to several tens of nanometers can be obtained at high yield as a result of carrying out thermal decomposition while generating carbon dioxide by heating an oxalate ion-alkylamine-alkyldiamine-silver complex compound formed in a reaction among a silver compound such as silver oxalate, a medium- to short-chain alkylamine and a medium- to short-chain alkyldiamine, and simultaneously reducing the silver ions.

As has been previously explained, since coated silver nanoparticles can be synthesized at high yield even if the ratio of silver atoms to the total amount of alkylamine and alkyldiamine is 1:1 (molar ratio) as in the present invention in comparison other methods used to synthesize coated silver nanoparticles that typically require an excess amount of alkylamine relative to silver, the amounts of alkylamine and alkyldiamine used can be reduced. In addition, since carbon dioxide formed by thermal decomposition of oxalate ions is easily removed outside the reaction system, there are no by-products derived from reducing agents, the coated silver nanoparticles can be easily separated from the reaction system, the resulting coated silver nanoparticles have high purity, and waste can be easily reduced and reaction raw materials can be easily recycled, thereby resulting in a production process having a low burden on the environment.

In addition, in comparison with conventional long-chain alkylamines such as oleylamine, medium- to short-chain alkylamines such as octylamine or medium- to -short-chain alkyldiamines such as N,N-dimethyl-1,3-diaminopropane used in the present invention rapidly react with silver oxalate, enable the reaction to be completed in a short period of time in the absence of solvent without requiring the use of a reaction solvent such as methanol or water, and allow the obtaining of an oxalate ion-alkylamine-alkyldiamine-silver complex compound. Furthermore, since medium- to short-chain alkyldiamines are highly reactive, silver oxalate is preferably reacted with medium- to short-chain alkylamines at a suitable ratio. In terms of molar ratio, the content of alkyldiamine among the amines that are reacted is preferably 90% or less, more preferably 70% or less and even more preferably 50% or less. Since the reaction can be carried out in the absence of solvent, the amount of resources consumed in the manufacturing of coated silver nanoparticles can be greatly reduced.

Since aliphatic amine-silver complex compounds containing large amounts of oleylamine were previously inadequate at low temperatures below 100° C. due to their slow thermal decomposition rate, there was the risk of a decrease in the yield of coated silver nanoparticles or a decrease in dispersibility of the resulting coated silver nanoparticles in solvent. In actuality, the optimum thermal decomposition temperature of aliphatic amine-silver complex compounds containing large amounts of long-chain oleylamine is 150° C., and not only do these complex compounds require an aggressive heating step, but there is also the problem of having to use a pressure vessel to synthesize coated silver nanoparticles in combination with an aliphatic amine having a boiling point in the vicinity of 150° C. or lower. In order to obtain coated silver nanoparticles having favorable dispersibility in non-polar solvents, it is necessary to increase molar ratio at which oleylamine is mixed to a ratio greater than a ratio of oleylamine to aliphatic amine of 1:2. On the other hand, although coated silver nanoparticles containing a large amount of high boiling point oleylamine (boiling point: 349° C.) have improved dispersibility in non-polar solvents, sintering of the coated silver nanoparticles becomes difficult at low temperatures of 120° C. or lower.

On the other hand, in the present invention, by using a medium- to short-chain alkyldiamine such as N,N-dimethyl-1,3-diaminopropane (boiling point: 136° C.) and a medium- to short-chain alkylamine such as octylamine (boiling point: 176° C.), the thermal decomposition reaction of the oxalate ion-alkylamine-alkyldiamine-silver complex compound proceeds in a short period of time even at a low temperature below 100° C., and coated silver nanoparticles can be synthesized at a high yield greater than 90%. Since this thermal decomposition reaction can be carried out at a low temperature and in a short period of time, high-yield synthesis of coated silver nanoparticles can be realized that are protected with various medium- to short-chain alkylamines and medium- to short-chain alkyldiamines having boiling points of 100° C. to 250° C. In addition, the amount of energy consumed for heating and the like during synthesis of the coated silver nanoparticles can be further reduced than in the prior art.

As explained in Table 1 on the basis of examples, in the case of coated silver nanoparticles coated with amines, which are protective molecules formed in this manner, 30% by weight or more of the protective molecules are eliminated when heated to 160° C. as determined by thermogravimetric analysis, metal gloss is demonstrated by sintering for several minutes at 120° C., and metal gloss is also demonstrated by sintering for less than 1 hour even at 100° C. In addition, as a result of using coated silver nanoparticles in which 50% by weight or more of the protective molecules are eliminated when heated to 160° C. as determined by thermogravimetric analysis, coated silver nanoparticles can be provided that demonstrate extremely superior sinterability, such as demonstrating a metal gloss even by sintering at 20° C. A metal coating is thought to be able to be formed due to the occurrence of sintering resulting from contact between surfaces of the silver nanoparticles as a result of the silver nanoparticles being exposed following elimination of the protective coating from the silver nanoparticles even at low temperatures in the vicinity of room temperature due to the silver nanoparticles being coated with a protective coating that can be eliminated at low temperatures.

In contrast, in the case of coated silver nanoparticles in the prior art in which the elimination rate of protective molecules when heated to 160° C. as determined by thermogravimetric analysis does not reach 30% by weight, sintering is required to be carried out for a long period of time in order to demonstrate metallic gloss at a temperature of about 100° C., thereby resulting in problems with productivity in terms of forming a metallic film on a resin substrate having low heat resistance.

The coated silver nanoparticles according to the present invention can be dispersed in a suitable solvent and can be stored for a longtime at room temperature. In particular, as was previously explained, since the present invention is characterized in that silver nanoparticles are coated using a medium- to short-chain alkylamine having a comparatively low molecular weight and a medium- to short-chain alkyldiamine having strong polarity, the affinity of the coated silver nanoparticles for polar solvents increases enabling them to be favorably dispersed in alcoholic solvents such as butanol or mixed solvents of non-polar'solvents such as octane and alcoholic solvents, and to be used by dispersing in a suitable solvent corresponding to the purpose of use. In addition, in the case of exposing the coated silver nanoparticles according to the present invention to a gaseous phase such as air, although sintering between the silver nanoparticles begins when the amines that compose the protective film are eliminated, by dispersing in a suitable dispersion medium, elimination of the amines can be suppressed, thereby making it possible to store the coated silver nanoparticles for a long period of time.

In contrast, in the case of either only a long-chain alkylamine or coated silver nanoparticles containing a large amount of a long-chain alkylamine for the protective molecules so as to prevent nanosized coated silver nanoparticles from aggregating, dispersibility in a polar solvent decreases remarkably. On the other hand, in the case of coated silver nanoparticles obtained by low-temperature thermal decomposition of an oxalate ion-medium- to short-chain alkylamine -medium- to short-chain alkyldiamine-silver complex compound as in the present invention, since the affinity thereof to polar solvents increases by containing a medium- to short-chain alkyldiamine having polarity stronger than that of the medium- to short-chain alkylamine in particular, the coated silver nanoparticles can be favorably dispersed in an alcoholic solvent such as butanol or a mixed solvent with a non-polar solvent such as octane. The volatility and viscosity of coated silver nanoparticles having superior dispersibility in polar solvents or mixed solvents of polar solvents and non-polar solvents can be easily adjusted by suitably selecting various variations such as the type of the dispersion media, the combination of solvents used and the mixing ratio thereof, thereby making these coated silver nanoparticles preferable for the manufacturing of ink able to be used in various printing technologies such as inkjet printing.

In order to for the protective molecules of the coated silver nanoparticles to be eliminated at a low temperature of 150° C. or lower or an even lower temperature of 120° C. or lower and undergo mutual sintering to demonstrate favorable electrical conductivity, it is desirable to synthesize the coated silver nanoparticles by combining a medium- to short-chain alkylamine and a medium- to short-chain alkyldiamine having boiling points of 250° C. or lower. The reaction conditions of thermal decomposition when manufacturing coated silver nanoparticles using a medium- to short-chain alkylamine alone are required to have a higher temperature and longer reaction time than in the case of combining with an alkyldiamine. Examples of medium- to short-chain alkylamines for obtaining coated silver nanoparticles able to sintered at 120° C. or lower include dodecylamine (248° C.) and octylamine (176° C.). Coated silver nanoparticles synthesized by using a medium- to short-chain alkylamine and medium- to short-chain alkyldiamine having boiling points of 100° C. to 250° C. in this manner are superior as materials for forming an electrically conductive film or electrically conductive wiring on a resin substrate having low heat resistance.

Although silver nanoparticles are expected to be used as a coloring material having vivid yellow color, since the maximum wavelength of the surface plasmon band thereof typically appears at a wavelength longer than 400 nm, problems occur when used as a vivid yellow coloring agent. In contrast, in the case of the thermal decomposition of the oxalate ion-alkylamine-alkyldiamine-silver complex compound of the present invention, coated silver nanoparticles can be easily obtained in which the maximum wavelength of the surface plasmon band is shorter than 400 nm, thereby making these nanoparticles useful as coloring materials of decorations and the like.

The coated silver nanoparticles according to the present invention having a maximum wavelength of the surface plasmon band shorter than 400 nm indicates that the silver atoms that compose the silver nanoparticles are composed of electrically neutral metallic silver, and indicates that the amines that compose the coating are bound to the metallic silver by coordinate bonds. In the present invention, by allowing the bonds between the amines that form the protective film and the silver nanoparticles to be weak bonds, and by specifying the amines that compose the protective film to be alkylamines and alkyldiamines having boiling points of 100° C. to 250° C., a protective film capable of being easily eliminated at low temperatures can be formed on the surfaces of the silver particles.

By coating onto a desired substrate by spin coating or inkjet printing using a dispersion of the coated silver nanoparticles according to the present invention dispersed in a suitable volatile dispersion medium and exposing to a suitable temperature of about 120° C. or lower, the dispersion medium is volatilized, the amines that form the protective film of the coated silver nanoparticles are eliminated, and the silver nanoparticles are sintered, resulting in the formation of a thin film of metallic silver on the substrate. By utilizing this phenomenon, a dispersion of the coated silver nanoparticles dispersed in a suitable dispersion medium can be used as an ink to form a metallic thin film on a desired substrate by printing.

When dispersing the coated silver nanoparticles according to the present invention in a solvent and the like used as a dispersion medium, under the condition that a protective film of silver nanoparticles is not eliminated, a dispersion in which the coated silver nanoparticles are dispersed is preferably obtained by removing the excess alkylamine and the like used when forming the protective film together with substituting with the solvent used. In particular, in the case of exposing the coated silver nanoparticles according to the present invention to air and the like, aggregation and sintering of the silver particles is begun when the protective film is eliminated at even a low temperature. Thus, when substituting the alkylamine and the like with a suitable solvent, that substitution is preferably carried out by selecting conditions such that the coated silver nanoparticles are not exposed directly to air. Typically, after centrifuging the coated silver nanoparticles obtained by thermal decomposition of the silver compound by heating the complex compound of the silver compound and amines and washing with a solvent such as methanol, a dispersion is preferably obtained by further adding the solvent used for the dispersion medium. In addition, in cases in which amines used when forming the coated silver nanoparticles may be allowed to remain in the dispersion of the coated silver nanoparticles, a dispersion of the coated silver nanoparticles can be easily obtained by preliminarily adding a dispersion medium of an ink for use as the reaction solvent when obtaining the coated silver nanoparticles from the complex compound of the silver compound and amines.

Although the content ratio of the coated silver nanoparticles in the dispersion of coated silver nanoparticles is suitably determined according to the purpose of use thereof, the coated silver nanoparticles can be stably stored at room temperature for 1 month or more even in the case of a dispersion in which the coated silver nanoparticles are dispersed at a high density of 30% by weight or more.

The following provides a more detailed explanation of the present invention.

(Silver Oxalate)

Silver oxalate has a high silver content and normally decomposes at 200° C. Since oxalate ions are removed as carbon dioxide allowing the obtaining of metallic silver when subjected to thermal decomposition, they are advantageous in terms of not requiring a reducing agent and having low levels of residual impurities. Consequently, since silver oxalate is preferably used for the silver compound serving as silver raw material for obtaining coated silver nanoparticles in the present invention, the following provides an explanation of the present invention for the case of using silver oxalate for the silver compound. However, as was previously described, in the complex compound formed between the silver compound and the prescribed amines, it goes without saying that the silver compound is not limited to the use of silver oxalate provided the silver compound can be thermally decomposed in a state in which the amines are coordinated to silver atoms.

There are no limitations on the silver oxalate used to carry out the present invention, and commercially available silver oxalate, for example, can be used. In addition, oxalate ions of the silver oxalate may be substituted with 20 mol % or less of one or more types of carbonate ions, nitrate ions and oxide ions. Substituting 20 mol % or less of the oxalate ions with carbonate ions in particular has the effect of enhancing thermal stability of the silver oxalate. There are cases in which thermal decomposition of the complex compound may become difficult if the substituted amount exceeds 20 mol %.

(Medium- to Short-Chain Alkyldiamine and Medium- to Short-Chain Alkylamine)

In particular, thermal decomposition at a low temperature of 100° C. or lower of an oxalate ion-alkylamine-alkyldiamine-silver complex compound containing an alkylamine and alkyldiamine having boiling points of 250° C. or lower allows coated silver nanoparticles to be obtained with high efficiency.

Although there are no particular limitations on the structure of the medium- to short-chain alkyldiamine, since it forms the complex compound by reacting with silver oxalate (since it coordinates with silver ions), at least one of the amino groups is preferably a primary amino group represented by $RNH_2$ (wherein, R represents a hydrocarbon chain) or a secondary amino group represented by $R_1R_2NH$ (wherein, $R_1$ and $R_2$ represent the same or different hydrocarbon chains).

The medium- to short-chain alkyldiamine is considered to have a boiling point of 100° C. or higher when considering the thermal decomposition temperature of the complex compound, and have a boiling point of 250° C. or lower when considering the low-temperature sinterability of the resulting coated silver nanoparticles. Examples of medium- to short-chain alkyldiamines include, but are not limited to, ethylenediamine (118° C.), N,N-dimethylethylenediamine (105° C.) N,N'-dimethylethylenediamine (119° C.), N,N-diethylethylenediamine (146° C.) N,N'-diethylethylenediamine (153° C.), 1,3-propanediamine (140° C.), 2,2-dimethyl-1,3-propanediamine (153° C.), N,N-dimethyl-1,3-diaminopropane (136° C.), N,N'-dimethyl-1,3-diaminopropane (145° C.), N,N-diethyl-1,3-diaminopropane (171° C.), 1,4-diaminobutane (159° C.), 1,5-diamino-2-methylpentane (193° C.) 1,6-diaminohexane (204° C.), N,N'-dimethyl-1,6-diaminohexane (228° C.), 1,7-diaminoheptane (224° C.) and 1,8-diaminooctane (225° C.)

Although there are no particular limitations on the structure of the medium- to short-chain alkylamine, since it forms the complex compound by reacting with silver oxalate (since it coordinates with silver ions), it is preferably a primary amino group represented by $RNH_2$ (wherein, R represents a hydrocarbon chain) or a secondary amino group represented by $R_1R_2NH$ (wherein, $R_1$ and $R_2$ represent the same or different hydrocarbon chains). In addition, the medium- to short-chain alkylamine is considered to have a boiling point of 100° C. or higher when considering the thermal decomposition temperature of the complex compound, and have a boiling point of 250° C. or lower when considering the low-temperature sinterability of the resulting coated silver nanoparticles. Examples of medium- to short-chain alkylamines include, but are not limited to, 2-ethoxyethylamine (105° C.), dipropylamine (107° C.), dibutylamine (159° C.), hexylamine (131° C.), cyclohexylamine (134° C.), heptylamine (155° C.), 3-butoxypropylamine (170° C.), octylamine (176° C.), nonylamine (201° C.), decylamine (217° C.), 3-aminopropyltriethoxysilane (217° C.) and dodecylamine (248° C.).

Examples of aliphatic hydrocarbon chains of the medium- to short-chain alkyldiamine and medium- to short-chain alkylamine include, but are not limited to, saturated aliphatic amines and unsaturated aliphatic amines.

Coated silver nanoparticles protected by a plurality of different alkylamines and alkyldiamines are obtained by simultaneously reacting a plurality of different medium- to short-chain alkylamines and medium- to short-chain alkyldiamines with silver oxalate and carrying out thermal decomposition of the resulting oxalate ion-alkylamine-alkyldiamine-silver complex compound. Dispersibility in a non-polar or polar solvent can be adjusted by suitably selecting the type, number, mixing ratio and the like of the medium- to short-chain alkylamine and medium- to short-chain alkyldiamine.

In the case of coated silver nanoparticles protected with a medium- to short-chain alkylamine and medium- to short-chain alkyldiamine having boiling points of 250° C. or lower, the protective molecules are removed by heating at, for example, 120° C. or lower and the coated silver nanoparticles are sintered each other resulting in the demonstration of favorable electrical conductivity even on a resin substrate having low heat resistance.

Although there are no particular limitations on the addition of a long-chain alkylamine during the thermal decomposition reaction of the oxalate ion-alkylamine-alkyldiamine-silver complex compound provided coated silver nanoparticles are obtained that have low-temperature sinterability of 120° C. or lower and superior dispersibility in solvent, since silver-adhered materials obtained by low-temperature sintering demonstrated practical electrical conductivity if the molar content of long-chain alkylamine was 20 mol % or less based on the total amount of medium- to short-chain alkylamine and medium- to short-chain alkyldiamine used, the case of using a long-chain alkylamine at 20 mol % or less based on the total amount of the alkylamine and the alkyldiamine is within the scope of the present invention.

In preparing the oxalate ion-alkylamine-alkyldiamine-silver complex compound in the present invention, although the molar ratio of the silver oxalate to the total amount of the alkylamine and alkyldiamine is preferably 1:2 to 1:4, it is not limited thereto. The oxalate ion-alkylamine-alkyldiamine-silver complex compound is formed as a result of amino groups of the alkylamine and alkyldiamine bonding to silver oxalate at a ratio of silver atoms: amino groups of 1:1. Thus, The stoichiometric ratio (molar ratio) of silver oxalate to the total amount of medium- to short-chain alkylamine and medium- to short-chain alkyldiamine becomes 1:2. The stoichiometric ratio (molar ratio) is also 1:2 in the case of using only silver oxalate and medium- to short-chain alkylamine. Consequently, since unreacted silver oxalate remains if the molar ratio of the medium- to short-chain alkylamine and medium- to short-chain alkyldiamine to silver oxalate is 2 or more, uniform thermal low-temperature decomposition of the complex compound is inhibited, which may result in a decrease in the yield of coated silver nanoparticles. This applies similarly to the case of using only silver oxalate and medium- to short-chain alkylamine. Conversely, although uniform thermal decomposition of the complex compound proceeds even if the ratio is 4 or more, since not only are the medium- to short-chain alkylamine and medium- to short-chain alkyldiamine used wastefully, but since this also leads to increased waste products, this is not preferable in economic terms. This applies similarly to the case of using only silver oxalate and medium- to short-chain alkylamine.

Although there are no particular limitations on the use of a reaction solvent such as methanol or water to form the silver oxalate ion-alkylamine-alkyldiamine-silver complex compound, in the case of using a medium- to short-chain alkylamine and medium- to short-chain alkyldiamine having boiling points of 250° C. or lower, the complex compound is formed solvent-free without using a solvent such as methanol. In addition, the complex compound formed in this manner can be directly converted to coated silver nanoparticles by the low-temperature thermal decomposition thereof. In this manner, since the manufacturing of coated silver nanoparticles according to the present invention can be carried out in the absence of solvent, manufacturing is possible that reduces resource consumption. Although there are no particular limitations on the method used to isolate the fabricated coated silver nanoparticles, as an example thereof, the coated silver nanoparticles can be isolated as a powder from the surplus alkylamine and alkyldiamine by centrifugal separation by adding a small amount of methanol or water and the like to the reaction mixture following thermal decomposition. Since the present invention involves solvent-free synthesis and does not use a reducing agent, in comparison with methods in which coated silver nanoparticles are synthesized in a large amount of organic solvent, the amount of organic solvent such as methanol used to isolate the coated silver nanoparticles can be greatly reduced.

In addition, in the present invention, a fatty acid such as oleic acid may be mixed into the amines as a dispersant for improving dispersibility of the coated silver nanoparticles formed in a dispersion medium. However, since the temperature at which the protective coating is eliminated from the coated silver nanoparticles tends to rise in the case of using an excess amount of fatty acid, the amount added thereof is preferably 5 mol % or less based on the silver atoms contained in the reaction system.

As has been described above, the manufacturing method of coated silver nanoparticles of the present invention allows the obtaining of coated silver nanoparticles at a high yield that have superior dispersibility in solvent and superior low-temperature sinterability by reacting silver oxalate with a medium- to short-chain alkyldiamine and a medium- to short-chain alkylamine to form a complex compound, and then subjecting this complex compound to low-temperature thermal decomposition. In addition, the coated silver nanoparticles can be manufactured using an extremely simple manufacturing process. Moreover, the resulting coated silver nanoparticles can be stably stored for a long period of time in the form of a powder or dispersed in a solvent.

Although the following indicates a method for manufacturing coated silver nanoparticles, evaluation of their dispersibility in a solvent and an evaluation of their low-temperature sinterability and the like as examples thereof, the present invention is not limited thereto.

EXAMPLE 1

2.04 g (20.0 mmol) of N,N-dimethyl-1,3-diaminopropane (Tokyo Chemical Industry, special grade), 1.94 g (15.0 mmol) of n-octylamine (Kao, purity: 98%) and 0.93 g (5.0 mmol) of n-dodecylamine (Kanto Chemical, special grade) were mixed followed by the addition to this mixed solution of 6.08 g (20.0 mmol) of silver oxalate (synthesized from silver nitrate (Kanto Chemical, grade 1) and ammonium oxalate monohydrate or oxalic acid dihydrate (Kanto Chemical, special grade) and stirring for 3 minutes to prepare an oxalate ion-alkylamine-alkyldiamine-silver complex compound. When this was stirred for 20 to 30 minutes while heating at 95° C., a reaction accompanied by foaming of carbon dioxide was completed, and the reaction mixture changed to a suspension having a blue glossy color. When 10 mL of methanol (Kanto Chemical, grade 1) were added thereto and the precipitate obtained by centrifugal separation was air-dried, 4.62 g (97.0% yield based on silver) of a solid were obtained in the form of coated silver nanoparticles having a blue glossy color.

[Analysis and Evaluation]

When the resulting blue glossy solid was analyzed by powder X-ray diffractometer (using the Rigaku Mini Flex II), metallic silver was confirmed to have been formed based on the powder X-ray diffraction pattern (FIG. 1). In addition, the solid was determined to be coated silver nanoparticles having a single crystallite size of 4.0 nm based on the signal half-width thereof.

The resulting solid was also confirmed to contain alkylamine and alkyldiamine based on the FT-IR spectrum (Jasco FT/IR-4100). The resulting solid was determined to contain 9.30% by weight of amine as protective molecules (FIG. 2) and the yield based on silver was 97.0% based on differential thermogravimetric analysis (determined using Shimadzu DTG-60 by heating at the rate of 10° C./min in synthetic air flowing at 80 mL/min). In addition, a considerable reduction in weight was observed at 100° C. or lower attributable to elimination of alkylamine and alkyldiamine, which are the protective molecules. On the basis of these findings, the resulting sample was clearly expected to demonstrate adequate electrical conductivity as a result of low-temperature sintering (see Example 3).

Figure 3:
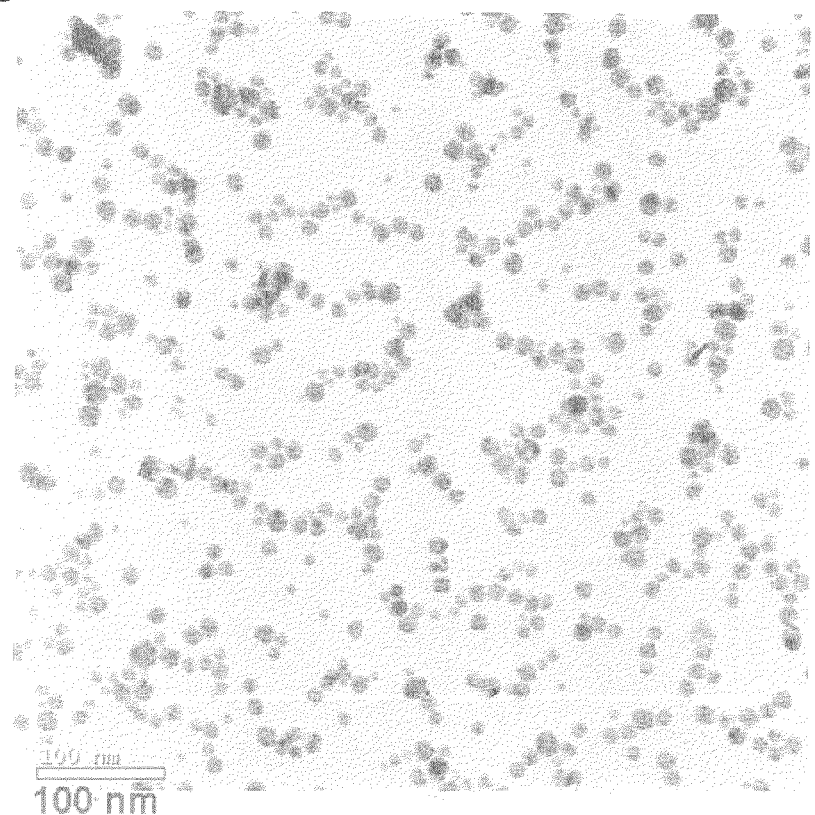
FIG. 3 indicates a transmission electron micrograph of coated silver nanoparticles observed after having dropped a dispersion of coated silver nanoparticles obtained in an Example 1 in a mixed solvent of n-butanol and n-octane onto a substrate (copper mesh, collodion film) and drying.

The resulting coated silver nanoparticles were observed with a transmission electron microscope (FEI Co., Model TECNAI-G2). Spherical particles of about 5 nm to 15 nm were observed (FIG. 3).

EXAMPLE 2

Figure 4:
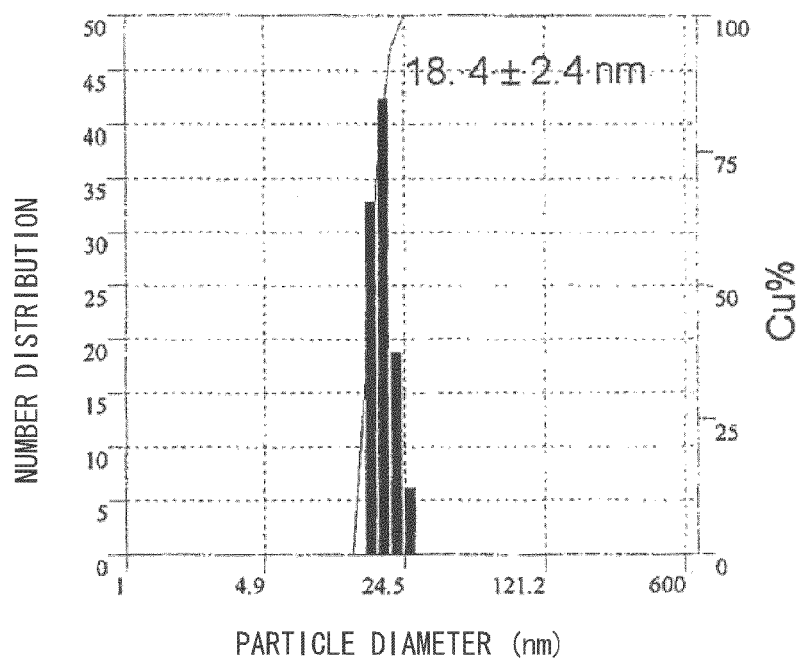
FIG. 4 indicates the particle size distribution of a dispersion of coated silver nanoparticles obtained in an Example 1 in a mixed solvent of n-butanol and n-octane (Example 2) as determined by dynamic light scattering.

The dispersibility of the coated silver nanoparticles obtained in Example 1 in solvent was evaluated. As a result, the coated silver nanoparticles favorably dispersed in n-butanol (Kanto Chemical, special grade) and a mixed solvent of n-butanol and n-octane (Kanto Chemical, special grade). The resulting coated silver nanoparticles were determined to favorably disperse at a number average particle diameter of 18 nm based on dynamic light scattering particle size measurement (Otsuka Electronics ELS-Z2M) of the resulting n-butanol and n-octane mixed solvent dispersion (FIG. 4). In addition, dispersions of coated silver nanoparticles having concentrations of 30% by weight or more were also able to be prepared from the resulting solid, and based on the ultraviolet-visible absorption spectra (Shimadzu UV3150) of those dispersions, a surface plasmon band was observed that was derived from coated silver nanoparticles having a maximum wavelength of less than 400 nm. In addition, the dispersions, for example that having a concentration of 40% by weight, were able to be stably stored at room temperature for 1 month or longer. The powder was also able to be similarly stably stored for 1 month or longer.

EXAMPLE 3

Figure 5:
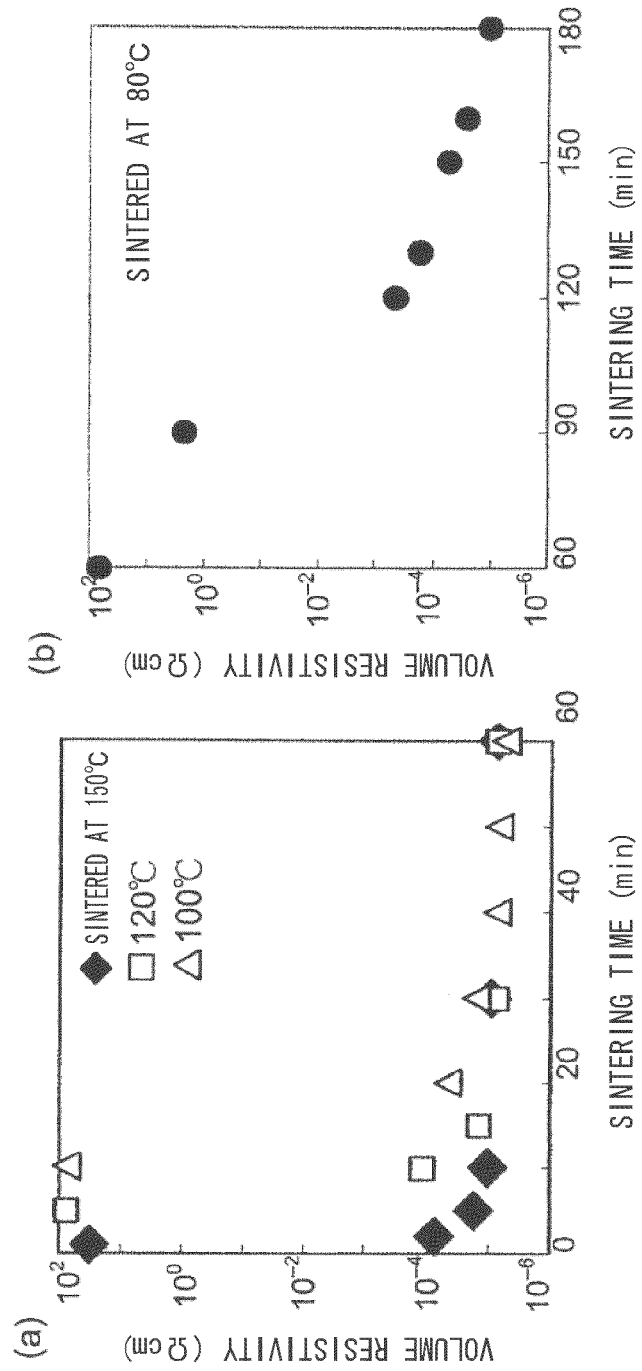
FIG. 5 indicates the electrical resistance (electrical conductivity) of a silver coating (Example 3) obtained by fabricating a spin-coated film of coated silver nanoparticles obtained in an Example 1 on a PET substrate and sintering at multiple stages of sintering temperatures.

Low-temperature sinterability was evaluated for the coated silver nanoparticles obtained in Example 1. A spin-coated film of the coated silver nanoparticles was fabricated on a polyethylene terephthalate (PET) substrate (Fuji Film Axia, OHP sheet) using the n-butanol dispersion of coated silver nanoparticles prepared in Example 2. The coated substrate was heat-sintered at 60° C., 80° C., 100° C., 120° C. and 150° C. followed by measurement of the electrical resistance thereof (Kyowa Riken, K-705RS, four-point probe method) (FIG. 5, logarithmic scale displayed on vertical axis). In the case of sintering at 150° C., a favorable electrically conductive film (metal gloss film) having volume resistivity of $10^{-5}$ Ωcm to $10^{-6}$ Ωcm near that of metallic silver was obtained in 10 minutes (FIG. 5(a)). After heating for 30 minutes in the case of sintering at 120° C., or after heating for 40 minutes in the case of sintering at 100° C., volume resistivity of $10^{-5}$Ωcm to $10^{-6}$ Ωcm was reached (FIG. 5(a)). Even in the case of low-temperature sintering at 80° C., a favorable electrically conductive film demonstrating volume resistivity of up to $10^{-5}$ Ωcm was obtained after heating for 3 hours (FIG. 5(b)). In addition, in the case of heating at 60° C., although sintering progressed slowly, a favorable electrically conductive film was obtained having volume resistivity up to $10^{-4}$ Ωcm was obtained after 15 hours.

EXAMPLE 4

When the dispersion of coated silver nanoparticles prepared in Example 2 was spin-coated onto a polyethylene film followed by heating for 1 to 2 hours at a temperature of 100° C., a polyethylene film having metallic gloss was obtained, and the film demonstrated favorable electrical conductivity, having volume resistivity of up to $10^{-5}$ Ωcm.

EXAMPLE 5

A polyester mesh (fiber thickness: 12.5 μm, fiber interval: 150 μm, optical transmittance: 80%) was immersed in the dispersion of coated silver nanoparticles fabricated in Example 2, and after drying the dispersion medium, the mesh adhered with the coated silver nanoparticles was heated for 1 hour at 100° C. to obtain a mesh having a silver gloss. When the electrical conductivity of this mesh material was measured, it was determined to have favorable optical transmittance, demonstrating resistivity of 300 mΩ/□.

EXAMPLE 6

The dispersion of coated silver nanoparticles prepared in Example 2 was coated onto medicine wrapping paper followed by drying the dispersion medium and heating for 1 to 2 hours at 100° C. to obtain paper having a silver gloss. When the electrical conductivity thereof was measured, it was determined to have favorable electrical conductivity, demonstrating resistivity of 600 mΩ/□.

EXAMPLE 7

2.16 g (16.7 mmol) of n-octylamine and 0.624 g (3.37 mmol) of n-dodecylamine were mixed followed by the addition of 3.04 g (10.0 mmol) of silver oxalate to this mixture and stirring for 10 minutes to prepare an oxalate ion-alkylamine-silver complex compound. When this was heated and stirred for 60 minutes at 100° C., the mixture changed to a suspension having blue glossy color. When 5 mL of methanol were added thereto and the precipitate obtained by centrifugal separation was air-dried, 2.25g (94.5% yield based on silver) of coated silver nanoparticles having a blue glossy color were obtained as a solid.

[Analysis and Evaluation]

Figure 6:
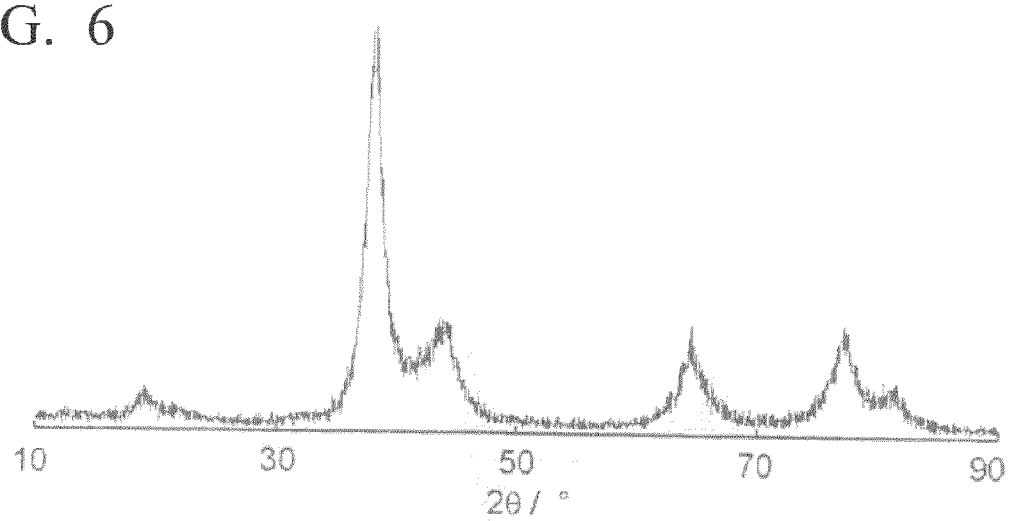
FIG. 6 indicates a powder X-ray diffraction pattern of coated silver nanoparticles obtained in an Example 7.
Figure 7:
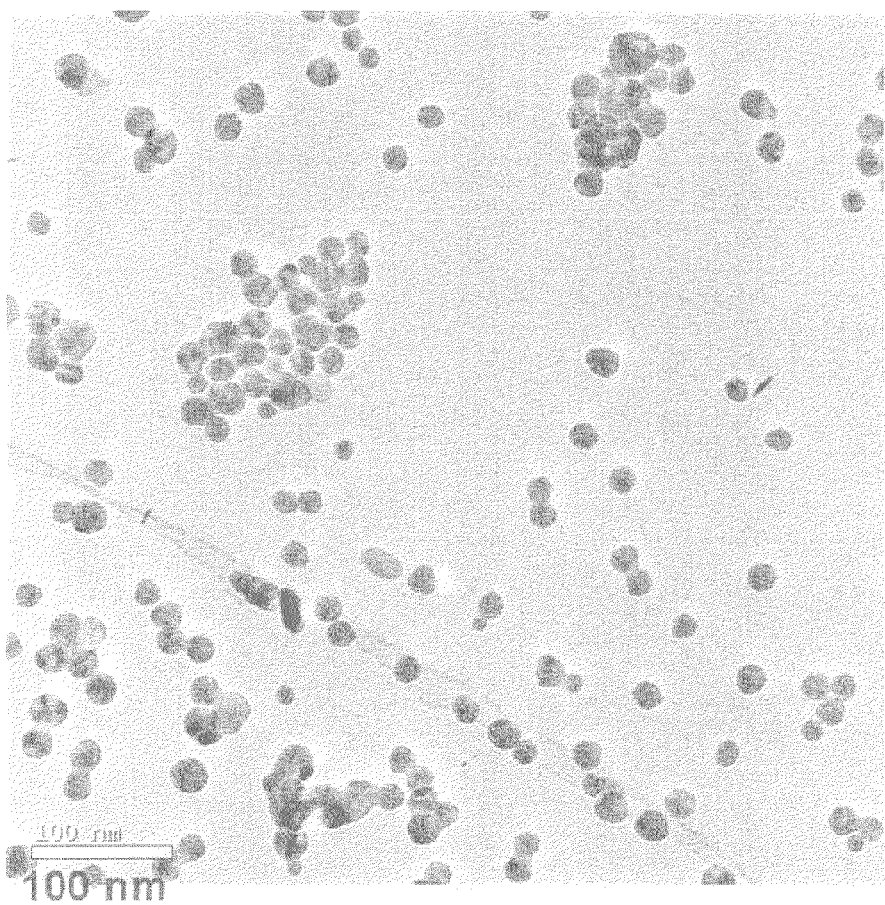
FIG. 7 indicates a transmission electron micrograph of coated silver nanoparticles observed after dropping a dispersion of silver nanoparticles obtained in an Example 7 dispersed in a mixed solvent of n-butanol and n-octane onto a substrate (copper mesh, collodion film) and drying.

When the resulting blue glossy solid was analyzed by powder X-ray diffractometer, metallic silver was confirmed to have been formed based on the powder X-ray diffraction pattern (FIG. 6). In addition, the solid was determined to be coated silver nanoparticles having a single crystallite size of 4.1 nm based on the signal half-width thereof. The resulting coated silver nanoparticles were observed with a transmission electron microscope. Spherical particles of about 10 nm to 20 nm were observed (FIG. 7). The resulting solid was confirmed to contain alkylamine based on the FT-IR spectrum. The resulting solid was determined to contain 9.30% by weight of alkylamine as protective molecules and the yield based on silver with respect to the silver acetate used was determined to be 94.5% based on thermogravimetric analysis.

EXAMPLE 8

Figure 8:
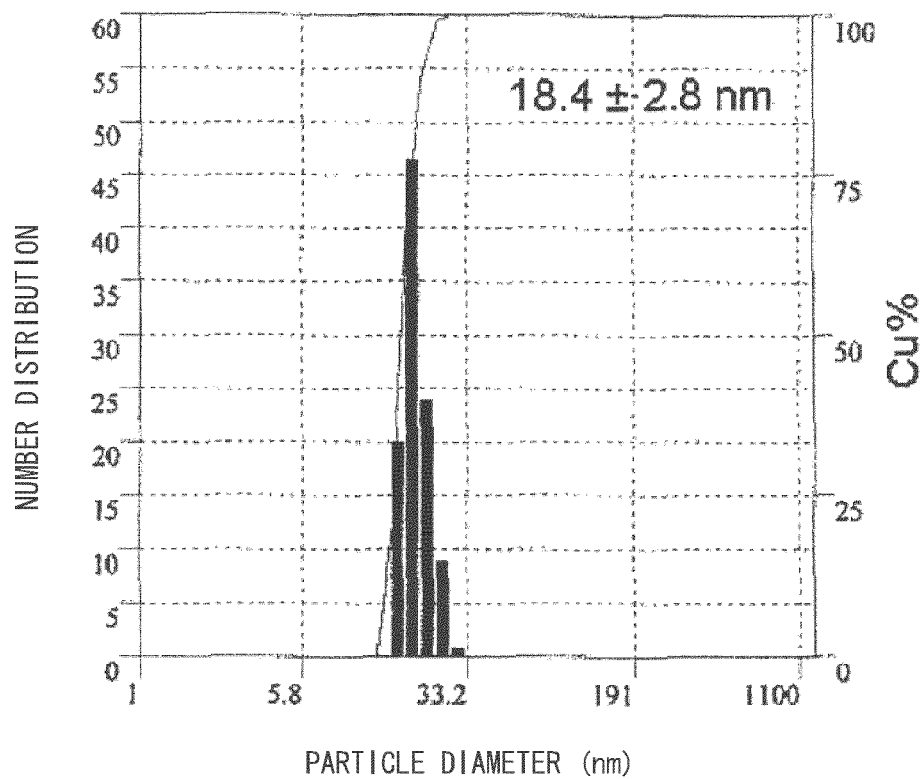
FIG. 8 indicates the particle size distribution of a dispersion of coated silver nanoparticles obtained in an Example 7 in a mixed solvent of n-butanol and n-octane as determined by dynamic light scattering.

As a result of having investigated dispersibility of the coated silver nanoparticles obtained in Example 7 in solvent, the coated silver nanoparticles favorably dispersed in a mixed solvent of n-butanol and n-octane. The resulting coated silver nanoparticles were determined to favorably disperse at a number average particle diameter of 18 nm based on dynamic light scattering particle size measurement of the dispersion (FIG. 8). In addition, dispersions of coated silver nanoparticles having concentrations of 30% by weight or more were also able to be prepared from the resulting solid. Based on the ultraviolet-visible absorption spectra of those dispersions, a surface plasmon band was observed that was derived from coated silver nanoparticles having a maximum wavelength of less than 400 nm. The dispersions, such as that having a concentration of 40% by weight, were able to be stably stored at room temperature for 1 month or longer. The powder was also able to be similarly stably stored for 1 month or longer.

EXAMPLE 9

Low-temperature sinterability was evaluated for the coated silver nanoparticles obtained in Example 7. A spin-coated film of the coated silver nanoparticles was fabricated on a PET substrate using the n-butanol and n-octane mixed solvent dispersion of coated silver nanoparticles prepared in Example 8. The coated substrate was heated at 100° C. and 120° C. followed by an investigation of the electrical resistance thereof. In the case of sintering at 120° C., a favorable electrically conductive film (metal gloss film) having volume resistivity of about $10^{-5}$ Ωcm to $10^{-6}$ Ωcm was obtained in 40 minutes. In the case of sintering at 100° C., volume resistivity of $10^{-5}$ Ωcm to $10^{-6}$ Ωcm was reached after heating for 120 minutes.

EXAMPLE 10

5.78 g (57.1 mmol) of n-hexylamine, 0.885 g (4.77 mmol) of n-dodecylamine, 3.89 g (38.1 mmol) of N,N-dimethyl-1,3-diaminopropane and 0.251 g (0.889 mmol) of oleic acid (Tokyo Chemical Industry, >85.0%) were mixed followed by the addition to this mixed solution of 7.60 g (25.0 mmol) of silver oxalate and stirring for about 1 hour to form an oxalate ion-alkylamine-alkyldiamine-silver complex compound that changed to a viscous solid. When this was stirred for 10 minutes while heating at 100° C., a reaction accompanied by foaming of carbon dioxide was completed, and the reaction mixture changed to a suspension having a blue glossy color. 10 mL of methanol were added thereto, the precipitate obtained by centrifugal separation was separated, 10 ml of methanol were again added and the precipitate was stirred to obtain a precipitate of coated silver nanoparticles by centrifugal separation. A mixed solvent of n-octane and n-butanol (volume ratio: 4:1 v/v) was then added to the precipitate of coated silver nanoparticles followed by stirring to obtain a dispersion in which the coated silver nanoparticles favorably dispersed at a concentration of 50% by weight. In addition, the yield based on silver of the coated silver nanoparticles was determined to be 97.0% based on the weight of the silver solid component that remained following thermogravimetric analysis of the coated silver nanoparticles.

Figure 10:
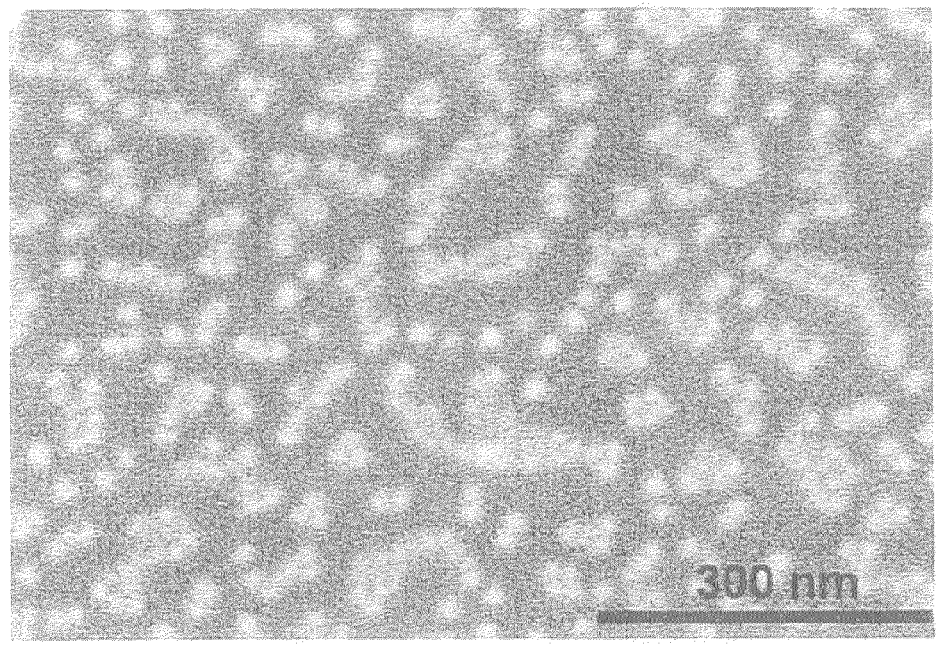
FIG. 10 indicates a scanning electron micrograph of coated silver nanoparticles observed after dropping a dispersion of coated silver nanoparticles obtained in an Example 10 in a mixed solvent of n-butanol and n-octane onto a substrate (copper mesh, microgrid) and drying. The white circles are silver nanoparticles.

The results of dropping the aforementioned mixed solvent dispersion on a substrate (copper mesh microgrid) and drying, followed by observing with a scanning electron microscope (Hitachi High-Technologies SU1510) are shown in FIG. 10. Spherical coated silver nanoparticles of about 5 nm to 20 nm were observed.

EXAMPLE 11

When the dispersibility of the dispersion of the coated silver nanoparticles in a mixed solvent of n-octane and n-butanol (volume ratio: 4:1 v/v) obtained in Example 10 was investigated by measurement of dynamic light scattering particle size measurement, the resulting coated silver nanoparticles were determined to favorably disperse at a number average particle diameter of 12 nm. In addition, based on the ultraviolet-visible absorption spectrum of the dispersion, a surface plasmon band was observed that was derived from coated silver nanoparticles having a maximum wavelength of less than 400 nm. In addition, the dispersion was able to be stably stored at room temperature for 1 month or longer.

EXAMPLE 12

Figure 9:
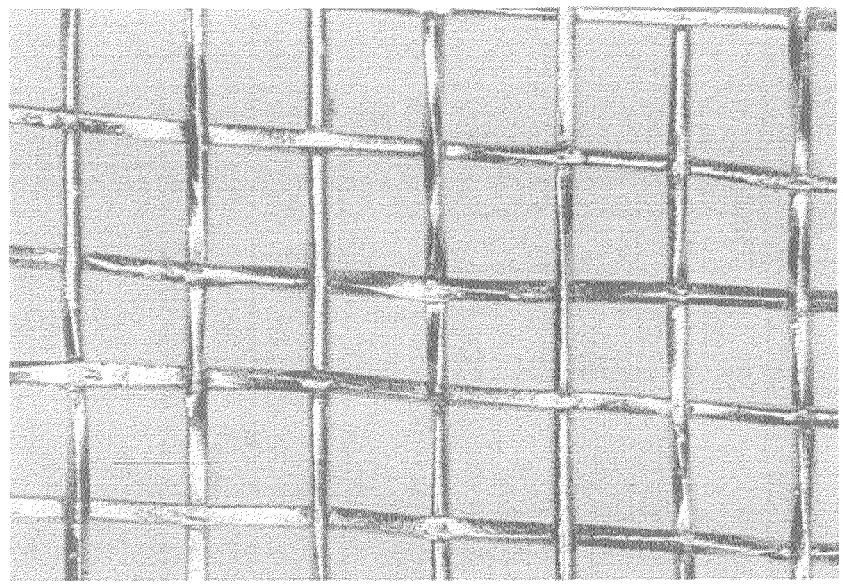
FIG. 9 indicates a micrograph of a mesh-like polyester material immersed in a dispersion of coated silver nanoparticles of an Example 10 after drying and heating (80° C.).

A polyester mesh (fiber thickness: 12.5 µm, fiber interval: 150 µm, optical transmittance: 80%) was immersed in the dispersion of coated silver nanoparticles fabricated in Example 10, and after drying the dispersion medium, the mesh adhered with the coated silver nanoparticles was heated for 1 hour at 80° C. to obtain a mesh having a silver gloss (FIG. 9). When the electrical conductivity of this mesh material was measured, it was determined to have favorable optical transmittance, demonstrating resistivity of 300 mΩ/□.

EXAMPLE 13

Figure 11:
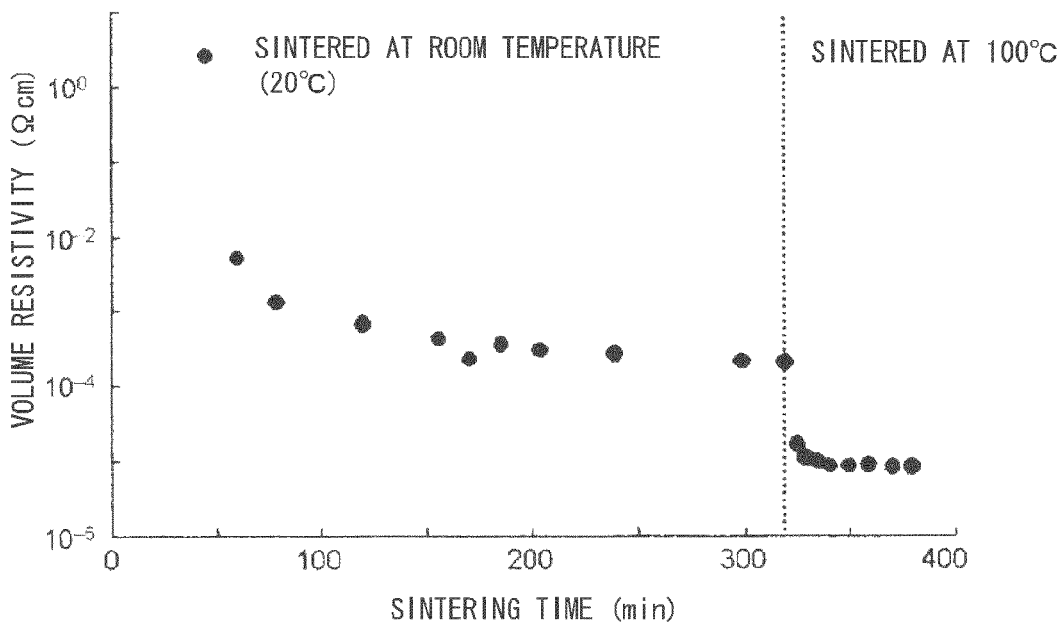
FIG. 11 indicates the electrical resistance of a silver coating obtained by allowing a spin-coated film onto a PET substrate using a dispersion of coated silver nanoparticles obtained in an Example 10 to stand at 20° C. followed by baking at 100° C. (Example 13).

In order to investigate the low-temperature sinterability of the coated silver nanoparticles obtained in Example 10, a spin-coated film of the coated silver nanoparticles was fabricated on a PET substrate using the n-octane and n-butanol mixed dispersion of coated silver nanoparticles prepared in Example 10. This was allowed to stand at room temperature (20° C.) followed by measurement of the electrical resistance (four-point probe method) thereof (FIG. 11, logarithmic scale displayed on vertical axis). Resistance values decreased suddenly after 1 to 2 hours and volume resistivity reached about $10^{-4}$ Ωcm after 5 hours, thereby demonstrating adequate electrical conductivity. When this coated film was further heated at 100° C., volume resistivity reached about $10^{-5}$Ωcm to $10^{-6}$ Ωcm within 30 minutes, indicating further improvement of electrical conductivity.

EXAMPLE 14

Figure 13:
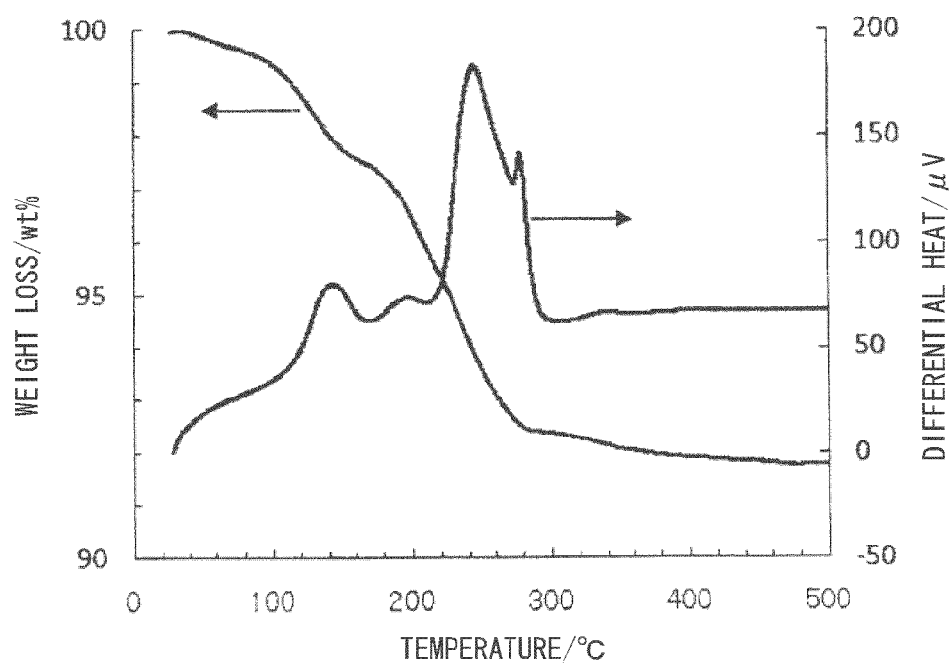
FIG. 13 indicates the results of thermal differential and thermogravimetric analyses of coated silver nanoparticles fabricated using the method of Example 3 of Patent Document 2.

When a blue film of coated silver nanoparticles (coated film A) was observed with an atomic force microscope (AFM, Shimadzu SPM-9600) immediately after spin-coating onto a PET substrate using the n-octane and n-butanol mixed dispersion of coated silver nanoparticles prepared in Example 10, spherical silver nanoparticles of about 5 nm to 20 nm were observed. In addition, when a coated film A was allowed to stand for 24 hours at room temperature (20° C.) and the resulting silver-colored sintered film (coated film B) was similarly observed by AFM, the coated film B was observed to demonstrate slight particle growth (20 nm to 30 nm) as compared with the coated film A. In addition, sintering between particles was observed to proceed to a greater degree than the coated films A and B in a coated film C in which electrical conductivity rapidly increased as a result of heating at 100° C. as shown in FIG. 13, and a metal coating composed of particles having a mean particle diameter of about 200 nm was determined to have been formed by AFM.

Comparative Example 1

Low-temperature sinterability was evaluated for coated silver nanoparticles fabricated according to the method described in Example 3 of Patent Document 2. As a result, although a spin-coated film fabricated on a PET substrate using an n-octane dispersion of the coated silver nanoparticles synthesized according to Example 3 of Patent Document 2 was heated for 3 hours at 80° C., sintering of the coated silver nanoparticles was not observed and electrical conductivity was not demonstrated. Even in the cases of heating at 100° C. and 120° C., hardly any electrical conductivity was demonstrated after heating for 2 hours.

When this result is compared with those of Examples 3, 9 and 13 of the present invention, the low-temperature sinterability of coated films of coated silver nanoparticles protected only with the alkylamine and alkyldiamine of the present invention without containing oleylamine, which is a long-chain alkylamine, was determined to have improved considerably in terms of the sintering temperature and sintering rate as compared with coated silver nanoparticles synthesized according to the method described in Example 3 of Patent Document 2.

Comparative Evaluation

Table 1 describes the results of evaluating sinterability demonstrated by coated silver nanoparticles after having dispersed the coated silver nanoparticles having a blue glossy color fabricated in Examples 1 and 10 of the present invention in a mixture of n-octane and n-butanol at a concentration of 30% by weight according to the method described in Examples 2 and 10, respectively, followed by placing spin-coated films of the coated silver nanoparticles fabricated on a PET substrate using the dispersions in a forced convection constant-temperature oven held at constant temperatures ranging from 20° C. to 120° C. Sinterability was evaluated by evaluating the amount of time until the coated silver nanoparticle films having a blue glossy color demonstrated a silver-colored metallic gloss as a result of sintering. In addition, for comparison purposes, the results of similar evaluations are also described in Table 1 that were obtained by dispersing coated silver nanoparticles fabricated under the conditions described in Examples 1 and 3 of Patent Document 2 in n-octane or toluene at a concentration of 30% by weight followed by spin-coating onto a PET substrate using those dispersions.

Figure 12:
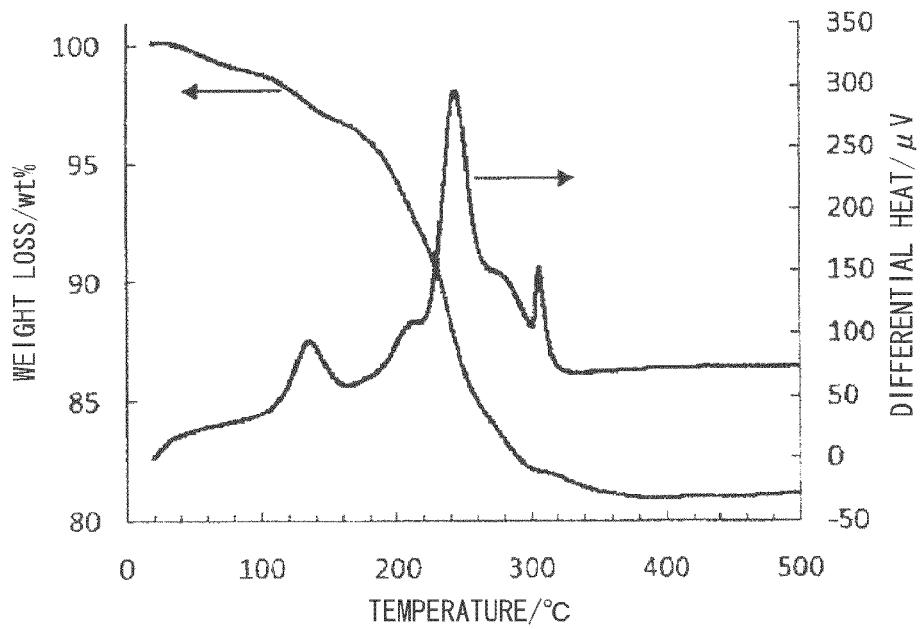
FIG. 12 indicates the results of thermal differential and thermogravimetric analyses of coated silver nanoparticles fabricated using the method of Example 1 of Patent Document 2.
Figure 14:
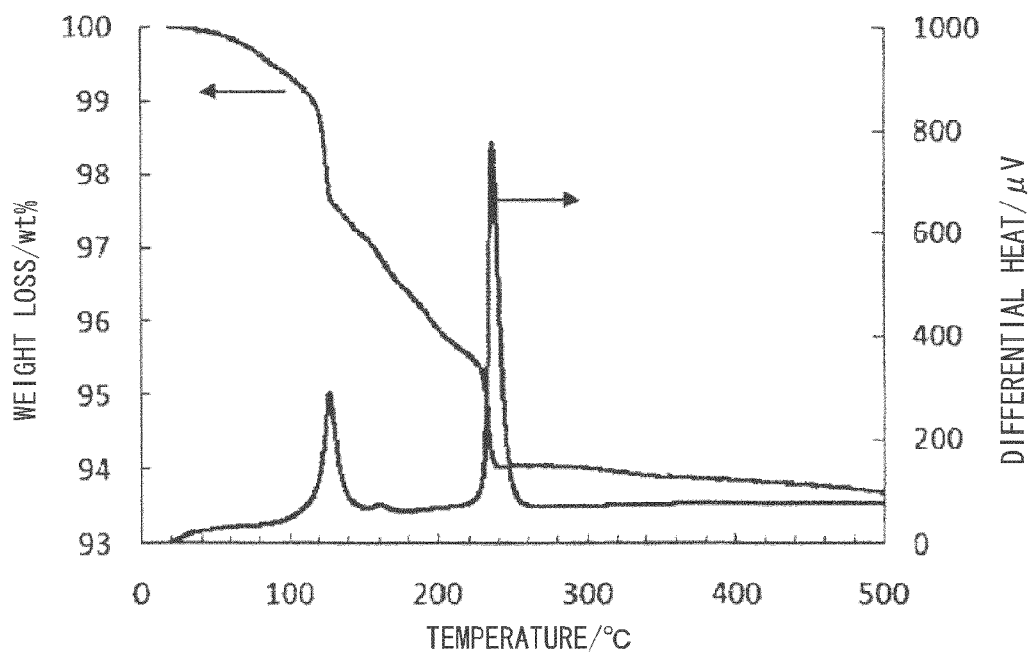
FIG. 14 indicates the results of thermal differential and thermogravimetric analyses of coated silver nanoparticles fabricated in Example 10.

In addition, the results of differential thermogravimetric analysis (determined using the Shimadzu DTG-60 by heating at the rate of 10° C./min in synthetic air flowing at 80 mL/min) of the coated silver nanoparticles respectively obtained in Examples 1 and 3 of Patent Document 2 and Example 10 of the present invention in the same manner as Example 1 of the present invention are respectively shown in FIGS. 12 to 14. In addition, values obtained by dividing weight loss following heating to 160° C. in thermogravimetric analysis of each of the coated silver nanoparticles by the total weight of the protective film of each of the coated silver nanoparticles (weight loss when weight becomes constant when heated to 400° C. to 500° C.) was determined as the weight loss rate of the protective film, and these values are shown in Table 1 along with the results of evaluating sinterability.

particles according to the present invention, by using coated silver nanoparticles in which 30% by weight or more of the protective film was eliminated when heated to 160° C. at the rate of 10° C./min in synthetic air flowing at 80 mL/min, coated silver nanoparticles spin-coated onto a substrate were clearly demonstrated to be able to form a silver coating as a result of sintering by heating at 120° C. for about 1 hour. In addition, in the case of using coated silver nanoparticles in which 35% by weight or more of the protective film is eliminated under similar measurement conditions, a silver coating was clearly demonstrated to be able to be formed as a result of rapid sintering by heating to about 100° C. Moreover, in the case of using coated silver nanoparticles in which 40% by weight, and preferably 50% by weight or more, of the protective film is eliminated under similar measurement conditions, in addition to sintering occurring rapidly by heating, a silver coating was able to be formed as a result of sintering by allowing to stand for about 24 hours in an environment at room temperature without any particular heating, thereby clearly demonstrating that a silver coating can be formed even on substrates having extremely

TABLE 1

| Silver nano-particles | Weight loss rate (%) | Heating temperature (heating time) | | | | | |
|---|---|---|---|---|---|---|---|
| | | 20° C. | 40° C. | 60° C. | 80° C. | 100° C. | 120° C. |
| Ex. 10 Present Invention | 51 (FIG. 14) | ○ (24 hrs) | ○ (14 hrs) | ○ (6 hrs) | ○ (1.5 hrs) | ○ (30 min) | ○ (10 min) |
| Ex. 1 Present Invention | 38 (FIG. 2) | X (24 hrs) | Δ (24 hrs) | ○ (15 hrs) | ○ (2.5 hrs) | ○ (30 min) | ○ (15 min) |
| Ex. 3 Patent Document 2 | 29 (FIG. 13) | X (24 hrs) | X (24 hrs) | X (24 hrs) | Δ (24 hrs) | ○ (18 hrs) ○Δ (15 hrs) X (11 hrs) | ○ (8 hrs) ○Δ (6 hrs) X (3 hrs) |
| Ex. 1 Patent Document 2 | 18 (FIG. 12) | X (24 hrs) | X (24 hrs) | X (24 hrs) | X (24 hrs) | ○Δ (24 hrs) Δ (18 hrs) X (11 hrs) | ○ (24 hrs) Δ (8 hrs) X (4 hrs) |

Testing of spin-coated thin film using dispersion of silver nanoparticles having concentration of 30% by weight in a Yamato DK240S forced convection constant-temperature oven. Visual confirmation of presence of silver (sintering): ○ silver color, mirrored surface, ○Δ silver color, mirrored surface but some blue remaining, Δ changing to silver color but prominent blue color overall, × prominent blue color only. Weight loss rates determined by differential thermogravimetric simultaneous measurement using Shimadzu DTG-60 (heating rate: 10° C./min, synthetic air flow rate: 80 mL/min) (weight loss rates (%) at 160° C. in FIGS. 2, 12, 13 and 14).

Although weight decreased in association with elimination of the protective film while heating in any of the coated silver nanoparticles, in the case of the coated silver nanoparticles obtained in Examples 1 and 10 of the present invention, weight clearly decreased at faster rate than in the coated silver nanoparticles described in Patent Document 2. As shown in Table 1, coated silver nanoparticles demonstrating large weight loss at low temperatures were observed to undergo sintering in a shorter period of time and at a lower temperature.

As a result of differential thermogravimetric analysis and evaluating sinterability for the various coated silver nanolow heat resistance or substrates that are difficult to heat for reasons such as having a large size simply by coating a dispersion of the coated silver nanoparticles and drying.

INDUSTRIAL APPLICABILITY

According to the present invention, coated silver nanoparticles can be provided that are able to be sintered even at a temperature of 120° C. or lower, and even at a temperature of 100° C. or lower in the vicinity of room temperature, thereby making it possible to form an electrically conductive film or electrically conductive wiring on a plastic substrate having low heat resistance such as PET or polypropylene. In addition, the aforementioned complex compound can be synthesized even in the absence of solvent and at low temperatures (room temperature). Moreover, coated silver nanoparticles can be obtained directly by thermal decomposition of the aforementioned complex compound at a low temperature in the vicinity of 100° C., and since it is not necessary to separately add a reducing agent as in other methods, the consumption of energy and resources can be greatly reduced. On the basis thereof, the present invention is extremely industrially useful.

Figure 2:
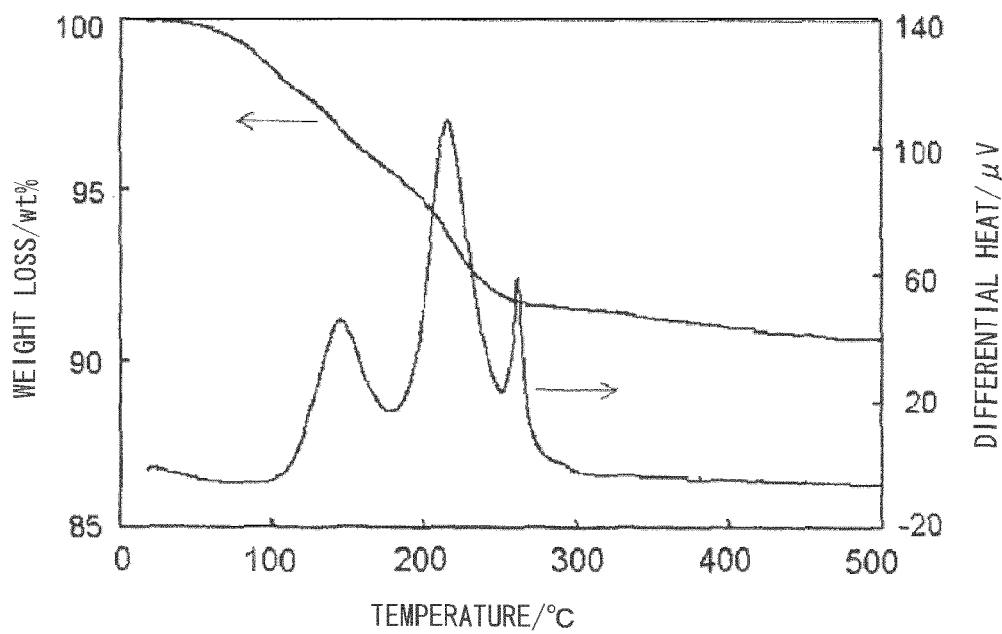
FIG. 2 indicates the results of thermogravimetric differential thermal analysis of coated silver nanoparticles obtained in an Example 1. The weight percentage of protective molecules amine (alkylamine, alkyldiamine) contained in the coated silver nanoparticles is determined from the thermal weight loss rate (wt %), and the elimination temperature of the protective molecules amine can be also determined. In addition, based on the results of differential thermal analysis, elimination of the protective molecules can be determined to be an exothermic reaction or endothermic reaction. Since elimination is in the form of an exothermic reaction in the case the differential thermal profile is facing upward, or in the form of an endothermic reaction in the case the differential thermal profile is facing downward, elimination of the protective molecules of the coated silver nanoparticles obtained in Example 1 is an exothermic reaction.

FIG. 2
  Weight loss/wt %
  Temperature/° C.
  Differential heat/μV
FIG. 4
  Number distribution
  Particle diameter (nm)
FIG. 5
  Volume resistivity (Ωcm)
  Sintered at 150° C.
  Sintering time (min)
  Volume resistivity (Ωcm)
  Sintered at 80° C.
  Sintering time (min)
FIG. 8
  Number distribution
  Particle diameter (nm)
FIG. 9
  Silver is uniformly coated onto each of the mesh fibers
FIG. 11
  Volume resistivity (Ωcm)
  Sintered at room temperature (20° C.)
  Sintered at 100° C.
  Sintering time (min)
FIG. 12
  Weight loss/wt %
  Temperature/° C.
  Differential heat/μV
FIG. 13
  Weight loss/wt %
  Temperature/° C.
  Differential heat/μV
FIG. 14
  Weight loss/wt %
  Temperature/° C.
  Differential heat/μV

The invention claimed is:

1. Coated silver nanoparticles having a mean particle diameter of 30 nm or less and coated with protective molecules, wherein the protective molecules contain as main components thereof a medium- to short-chain alkylamine having a boiling point within the range of 100° C. to 250° C. and a medium- to short-chain alkyldiamine having a boiling point within the range of 100° C. to 250° C., and
  one of the amino groups possessed by the medium- to short-chain alkyldiamine is a tertiary amine.

2. A coated silver nanoparticle dispersion, comprising the coated silver nanoparticles according to claim 1 dispersed in a dispersion medium.

3. Coated silver nanoparticles having a mean particle diameter of 30 nm or less and coated with protective molecules, wherein the protective molecules contain as main components thereof a medium- to short-chain alkylamine having a boiling point within the range of 100° C. to 250° C. and a medium- to short-chain alkyldiamine having a boiling point within the range of 100° C. 250° C., and the protective molecules further contain a fatty acid.

4. A coated silver nanoparticle dispersion, comprising the coated silver nanoparticles according to claim 3 dispersed in a dispersion medium.

5. A method of manufacturing coated silver nanoparticles, comprising: mixing a silver compound that forms metallic silver when decomposed by heating, a medium- to short-chain alkylamine having a boiling point of 100° C. to 250° C. and a medium- to short-chain alkyldiamine having a boiling point of 100° C. to 250° C. to prepare a complex compound; and thermally decomposing the silver compound by heating the complex compound.

6. The manufacturing method of according to claim 5, wherein the silver compound that forms metallic silver when decomposed by heating is silver oxalate.

7. The manufacturing method of according to claim 5, wherein the content ratio of the alkyldiamine to the total amount of amines in the alkylamine and alkyldiamine mixed with the silver compound is 10 mol % to 90 mol %.

8. The manufacturing method according to claim 5, wherein further comprising admixing a fatty acid with the silver compound, alkylamine and alkyldiamine, wherein the amount of the fatty acid is at 5 mol % or less based on the silver atoms contained in the reaction system.

* * * * *